United States Patent [19]
Charych et al.

[11] Patent Number: 6,017,390
[45] Date of Patent: Jan. 25, 2000

[54] GROWTH OF ORIENTED CRYSTALS AT POLYMERIZED MEMBRANES

[75] Inventors: Deborah H. Charych, Albany, Calif.; Amir Berman, Ben-Shiva, Israel

[73] Assignee: The Regents of the University of California, Calif.

[21] Appl. No.: 08/898,104

[22] Filed: Jul. 22, 1997

Related U.S. Application Data

[60] Provisional application No. 60/022,739, Jul. 24, 1996.

[51] Int. Cl.$^7$ .................................................. C30B 29/54
[52] U.S. Cl. .............................. 117/68; 117/72; 117/925; 117/926; 117/927; 117/944; 117/938; 117/937; 428/323; 428/451; 428/689; 428/700
[58] Field of Search ...................................... 117/925, 926, 117/927, 6, 8, 72, 944, 938, 937; 428/323, 457, 200, 689

[56] References Cited

U.S. PATENT DOCUMENTS

| | | |
|---|---|---|
| 4,859,538 | 8/1989 | Ribi . |
| 5,268,305 | 12/1993 | Ribi et al. . |
| 5,427,915 | 6/1995 | Ribi et al. . |
| 5,480,582 | 1/1996 | Pope . |
| 5,491,097 | 2/1996 | Ribi et al. . |
| 5,571,568 | 11/1996 | Ribi et al. . |
| 5,622,872 | 4/1997 | Ribi . |

OTHER PUBLICATIONS

Addadi and Weiner, "Interactions between acidic proteins and crystals: Stereochemical requirements in biomineralization," *Proc. Natl. Acad. Sci.* 82: 4110–4114 [1985].

Berman et al., "Biological Control of Crystal Texture: A Widespread Strategy for Adapting Crystal Properties to Function," *Science* 259:776–779 [1991].

Binnig et al., "Atomic Force Microscope," *Phys. Rev. Lett.* 12: 930–933 [1986].

Binnig et al., "Atomic Resolution with Atomic Force Microscope," *Europhys. Lett.* 3: 1281–1286 [1987].

Charych et al. "Direct Colorimetric Detection of a Receptor–Ligand Interaction by a Polymerized Bilayer Assembly," *Science* 261: 585–588 [1993].

Day and Lando, "Morphology of Crystalline Diacetylene Monolayers Polymerized at the Gas–Water Interface," *Macromolecules* 13: 1478–1483 [1980].

Fendler, *Membrane Mimetic Chemistry*, Wiley, New York [1982].

Goettgens et al., "Molecular Order in Polymerizable Langmuir–Blodgett Films Probed by Microfluorescence and Scanning Force Microscopy," *Langmuir* 8: 1768–1774 [1992].

Heywood, "Biomineralization: New Directions in Crystal Science," *Microsc. Res. Tech.* 27:376–388 [1994].

Heywood et al., "Oriented Crystallization of $CaCO_3$ under Compressed Monolayers," *J. Chem. Soc. Faraday Trans.* Part 2, 87: 735–743 [1991].

Heywood and Mann, "Template–Directed Nucleation and Growth of Inorganic Materials," *Adv. Mater.* 6:9–20 [1994].

Jacquemain et al., "Two–Dimensional Crystallography of Amphiphilic Molecules at the Air–Water Interface," *Angew. Chem. Int. Ed. Engl.* 31: 130–152 (1992).

Kolbe et al., "Atomic force microscopy imaging of T4 bacteriophages on silicon substrates," *Ultramicroscopy* 42–44: 1113–1117 [1992].

Krämer, "Biosensors for Measuring Pesticide Residues in the Environment: Past, Present, and Future," *J. AOAC Intern.* 79:1245–1254 [1996].

Landau et al., "Transfer of structural information from Langmuir monolayers to three–dimensional growing crystals," *Nature* 318: 353–356 [1985].

Landau et al., "Langmuir Monolayers Designed for the Oriented Growth of Glycine and Sodium Chloride Crystals at Air/Water Interfaces," *Mol. Cryst. Liq. Cryst.* 134:323–335 [1986].

Lieser et al., "Structure Phase Transitions and Polymerizability of Multilayers of Some Diacetylene Monocarboxylic Acids," *Thin Solid Films* 68: 77–90 [1980].

Lippmann, *Sedimentary Carbonate Minerals*, Springer–Verlag, New York, pp. 1–229 (1973).

Lowenstam and Weiner, *On Biomineralization*, Oxford Univ. Press, New York, [1989].

Majewski et al., "Electron Microscopy Studies of Amphiphilic Self–Assemblies on Vitreous Ice," *Adv. Mater.* 7:26–35 (1995).

Maoz and Sagiv, "On the Formation and Structure of Self-Assembling Monolayers," *J. Colloid Interface Sci.* 100: 465–496 [1984].

Rieke et al., "Spatially Resolved Mineral Deposition on Patterned Self–Assembled Monolayers," *Langmuir* 10:619–622 (1994).

Roberts, *Langmuir–Blodgett Films*, Plenum, New York, [1990].

Rochow and Tucker, *Introduction to microscopy by means of light, electrons, X–rays, or acoustics*, Plenum Press [1994].

Tieke and Lieser, "Influences of the Structure of Long–Chain Diynoic Acids on Their Polymerization Properties in Langmuir–Blodgett Multilayers," *J. Colloid Interface Sci.* 88: 471–486 [1982].

Ulman, *An Introduction to Ultrathin Organic Films*, Academic Press, New York [1991].

Weiner, "Organization of Extracellularly Mineralized Tissues: A Comparative Study of Biological Crystal Growth," *CRC Crit. Rev. Biochem.* 20: 365–407 [1986].

Zhao et al., "Epitaxial Formation of PbS Crystals under Arachidic Acid Monolayers," *J. Phys. Chem.* 96: 9933–9939 [1992].

Bunker et al., "Ceramic Thin–Film Formation on Functionalized Interfaces Through Biomimetic Processing," *Science* 264:48–55 (1994).

Hughes et al., "Controlled Deposition of Strontium Sulphate on Behenic Acid Langmuir–Blodgett Multilayers," *J. Phys. D: Appl. Phys.* 24:146–153 (1991).

Huo et al., "Organization of Organic Molecules with Inorganic Molecular Species into Nanocomposite Biphase Arrays," *Chem. Mater.* 6:1176–1191 (1994).

Oliver et al, "Lamellar aluminophosphates with surface patterns that mimic diatom and radiolarian microskeletons," *Nature* 378:47–50 (1995).

Feng and Bein, "Vertical Aluminophosphate Moleuclar Sieve Crystals Grown at Inorganic–Organic Interfaces," *Science* 265:1839–1842 (1994).

Firouzi et al., "Cooperative Organization of Inorganic–Surfactant and biomimetic Assemblies," *Science* 267:1138–1143 (1995).

Majewski et al., "Electron Diffraction and Imaging of Uncompressed Monolayers of Amphiphilic Molecules on Vitreous and Hexagonal Ice," *Science* 261:899–902 (1993).

Frostman et al., "Nucleation and Growth of Molecular Crystals on Self–Assembled Monolayers," *Langmuir* 10:576–582 (1994).

Lipkin, "Crystal–Coated Lipids Promise New Materials," *Nature* 144:69 (1993).

Heuer et al., "Innovative Materials Processing Stragegies: A biomimetic Approach," *Science* 255:1098–1105 (1992).

Wilson, "Protein Crystallization Method May Have Broad Applications," *Chem. & Eng. News*, pp. 6–7 (May 6, 1996).

Mann et al., "Structural and Stereochemical Relationships Between Langmuir Monolayers and Calcium Carbonate Nucleation," *J. Phys. D: Appl. Phys.* 24:154–164 (1991).

Hostomsky and Jones, "Calcium Carbonate Crystallization, Agglomeration and Form During Continuous Precipitation From Solution," *J. Phys. D: Appl. Phys.* 24:165–170 (1991).

Carter et al., "Nanoscale Surface Topography and Growth of Molecular Crystals: The Role of Anisotropic Intermolecular Bondings," *J. Am. Chem. Soc.* 116:944–953 (1994).

Hillier and Ward, "Atomic Force Microscopy of the Electrochemical Nucleation and Growth of Molecular Crystals," *Science* 263:1261–1264 (1994).

Davey et al., "Molecular Design Based on Recognition at Inorganic Surfaces," *Nature* 353:549–550 (1991).

Dagani, "Simple Method Makes Cell Skeleton Mimics," *Chem. & Eng. News* p. 7 (Nov. 6, 1995).

Schimmel et al., "Layer–by–Layer Growth and Decomposition of an Organic Crystal Observed in Real Time by Atomic Force Microscopy," *Adv. Matter* 6(4):307–311 (1994).

Calvert, "Biomimetic Ceramics and Composites," *MRS Bulletin* pp. 37–40 (Oct. 1992).

Coltrain et al., "Role of Trialkoxysilane Functionalization in the Preparation of Organic–Inorganic Composites," *Chem. Mater.* 5:1445–1455 (1993).

Christiansen and Silver, "The pH–Dependent Mineralization of a Reconstituted Collagen Fiber: Physical and Ultrastructural Characterization," *Biomimetics* 1(4):265–291 (1992).

Monnier et al., "Cooperative Formation of Inorganic–Organic Interfaces in the Synthesis of Silicate Mesostructures," *Science* 269:1299–1303 (1993).

Bagshaw et al., "Templating of Mesoporous Molecular Sieves by Nonionic Polyethylene Oxide Surfactants," *Science* 269:1242–1244 (1995).

Wheeler and Sikes, "Matrix–Crystal Interactions in $CaCO_3$; Biomineralization," *Biomineralization: Chemical and Biochemical Perspectives*. Mann et al. (ed), pp. 95–131; VCH, Weinheim (1989).

Wheeler and Sikes, "Calcium Mineral–Peptide Interactions," *Mat. Res. Soc. Symp. Proc.* 174:45–50 (1990).

Golden et al., "Monodisperse Metal Clusters 10 Angstroms in Diameter in a Polymeric Host: The 'Monomer as Solvent' Approach," *Science* 268:1463–1466 (1995).

Morse et al., "Genetic Coding in biomineralization of Microlaminate Composites," *Mat. Res. Soc. Symp. Proc.* 292:59–67 (1993).

Rieke and Bentjen, "Deposition of Cadmium Sulfide Films by Decomposition of Thiourea in Basic Solutions," *Chem. Mater.* 5:43–53 (1993).

Kessel and Granick, "Formation and Characterization of a Highly Ordered and Well–Anchored Alkylsilane Monolayer on Mica by Self–Assembly," *Langmuir* 7:532–538 (1991).

Miyasaka et al., "Oriented Polypeptide Monolayers by Rapid Spontaneous Condensation of Amphiphilic Amino Acid Esters," *The Solid Films* 210/211:393–396 (1992).

Perez et al., "Toward Inorganic Monlayers Inserted in a Langmuir–Blodgett Matrix," *Thin Solid Films* 210/211:410–411 (1992).

Tanev and Pinnavaia, "Biomimetic Templating of Porous Lamellar Silicas by Vesicular Surfactant Assemblies," *Science* 271:1267–1269 (1996).

Shimomura et al., "'Crystal Engineering' Based on Two–Dimensional Molecular Assemblies. Relation between Chemical Structure and Molecular Orientation in Cast Bilayer Films,"*Langmuir* 11:969–976 (1995).

St. Pierre et al., "Biomineralization of Iron: Mössbauer Spectroscopy and Electron Microscopy of Ferritin Cores from the Chiton *Acanthopleura hirtosa* and the Limpet *Patella laticostata*, " *Inorg. Chem.* 29:1870–1874 (1990).

Kirschvink et al., "Magnetite Biomineralization in the Human Brain," *Proc. Natl. Acad. Sci USA* 89:7683–7687 (1992).

Charych et al., "Specific Interaction of Influenza Virus with Organized Assemblies of Polydiacetylenes," *Mat. Res. Soc. Symp. Proc.* 282:153–161 (1993).

Spevak, "The Presentation of Biological Ligands on the Surface of Polymerized Monolayers and Liposomes," Ph.D. Dissertation, University of California at Berkeley (1993).

Dagani, "Lipids and Minerals Form Novel Composite Microstructures," *Chem. & Eng. News*, 19–20 (1993).

Leung et al., "Imaging of polydiacetylene on graphite by scanning tunneling microscopy," *J. Appl. Phys.* 69(4):2044–2047 (1991).

Pons et al., "The Optical Activity and Circular Dichroic Spectra of Diacetylenic Phospholipid Polymers." *Biochim. Biophys. Acta* 693:461–465 (1982).

Berman et al., "Total Alignment of Calcite at Acidic Polydiacetylene Films: Cooperativity at the Organic–Inorganic Interface," *Science* 269:515–518 (1995).

Ahn et al., "Probing the Dynamics of Template–Directed Calcite Crystallization with in Situ FTIR," *J. Phys. Chem.* 100(30):12455–12461 (1996).

Yamanaka et al., "Solid Phase Immobilization of Optically Responsive Liposomes in Sol–gel Materials for Chemical and Biological Sensing," *Langmuir* 13:5049–5053 (1997).

*Primary Examiner*—Robert Kunemund
*Attorney, Agent, or Firm*—Medlen & Carroll, LLP

[57] ABSTRACT

The present invention relates to methods and compositions for the growth and alignment of crystals at biopolymeric films. The methods and compositions of the present invention provide means to generate a variety of dense crystalline ceramic films, with totally aligned crystals, at low temperatures and pressures, suitable for use with polymer and plastic substrates.

38 Claims, 10 Drawing Sheets

GROWTH OF ORIENTED CRYSTALS AT POLYMERIZED MEMBRANES

This application for patent under 35 U.S.C. § 111(a) claims priority to Provisional Application Ser. No. 60/022,739 filed on Jul. 24, 1996, under 35 U.S.C. § 111(b).

FIELD OF THE INVENTION

The present invention relates to methods and compositions for the growth and alignment of crystals at biopolymeric films.

BACKGROUND OF THE INVENTION

Developing methods to control the molecular orientation of crystals is a major goal of the material fabrication industry and has occupied the focus of many studies and research efforts. In particular, the total alignment and orientation of particulate and dense crystalline ceramic films at low temperatures is important for a number of technological applications such as chemical and biological sensors, optical wave guides, optical coatings, and films with magnetic and electrical functions (e.g., magnetic information storage). The commercial value of biosensors alone, has been estimated at $150–200 million with predictions for growth to several hundred billion dollars within the next decade (Krämer, J. AOAC Intern. 79: 1245 [1996]). For many of these applications, conventional processing techniques (e.g., high vacuum beam technologies) cannot be used because they require extremely high temperatures or pressures that would destroy delicate components of the devices. Unfortunately, control of total crystal alignment is not achieved by any of the currently available methods of crystal growth and production at mild temperatures and pressures.

However, in nature, the mineralization of highly oriented inorganic crystals occurs routinely at organic templates (e.g., proteins and oligosaccharides). Biosynthesis of these materials evolves in aqueous media, at mild temperature and pressure conditions. Biological organisms are capable of producing crystals with specific size, morphology, orientation, and texture (Lowenstam and Weiner, *On Biomineralization*, Oxford Univ. Press, New York, [1989]; and Berman et al., Science 259: 776 [1993]). Such inorganic minerals are used by the organisms for support structures, armor, weapon, gravity sensors, magnetic detectors, and homeostatic devices (Heywood, Microsc. Res. Tech. 27: 376 [1994]).

Organisms achieve control over crystal properties with the use of an organic polymeric "matrix" of highly acidic macromolecules. One mechanism used to orient the crystals involves intercalation of the macromolecules into the crystal lattice (Berman et al., supra.). In certain cases, the minerals that are formed by biological organisms are uniquely oriented or co-aligned relative to the organic matrix (Weiner, CRC Crit. Rev. Biochem. 20: 365 [1986]). To date, however, the in vitro synthesis of novel organic-inorganic composites, with properties analogous to those produced in vivo, have not been achieved and continue to challenge materials scientists.

The nature of the organic-inorganic interactions during crystal formation at biological matrices is poorly characterized. Studies have indicated that the stereochemical match between the organic and inorganic interfaces is a predominant factor in determining the specific nucleation face type generated. However, there are several difficulties that have prevented accurate analyses of these phenomena. To date, structural information regarding the organic monolayer templates have only been obtained in the absence of mineralization (e.g., from grazing incidence x-ray diffraction, electron diffraction, and x-ray reflectivity [Majewski et al., Adv. Mater. 26: 7 (1995); and Jacquemain et al., Angew. Chem. Int. Ed. Engl. 31: 130 (1992)]). Additionally, it is believed that synergistic changes in the organic template structure occur upon interaction with solid interfaces, as is the case when crystals form at the hydrophilic head-group regions of membranes (Heywood et al., J. Chem. Soc. Faraday Trans. Part 2, 87: 735 [1991]). In such cases, in situ structural information regarding the organic template is even more elusive, as dynamic changes in monolayer organization may occur. These difficulties have, in part, prevented the development of techniques for controlling the alignment of crystal growth at biological matrices.

Simplified surfactant molecular assemblies (Ulman, *An Introduction to Ultrathin Organic Films*, Academic Press, New York [1991]; and Fendler, *Membrane Mimetic Chemistry*, Wiley, N.Y. [1982]) resembling biological membranes (e.g., monolayers, multilayers, or vesicles) have been used in attempts at oriented crystalline growth. Several groups have demonstrated the nucleation and growth of organic (Landau et al., Nature 318: 353 [1985]) and inorganic crystals at these monolayer assemblies (Landau et al., Mol. Cryst. Liq. Cryst. 134: 323 [1986]; Heywood and Mann, Adv. Mater. 6: 9 [1994]; and Zhao et al., J. Phys. Chem. 96: 9933 [1992]). However, the crystals produced by these methods are randomly oriented or oriented only in the direction normal to the membrane plane (i.e., oriented in a manner where a given face of a crystal is in contact with the plane of the template upon which it is grown) (Heywood and Mann supra; and Zhao et al., supra.) and thus are not suitable for many applications.

Current technologies do not provide methods for totally oriented crystal growth (i.e., orientation along an identifiable structural feature of the template with crystals oriented about all three crystallographic axes) under mild conditions of temperature and pressure. In these prior attempts, the crystal axes in the plane of nucleation have not been aligned with a structural parameter of the nucleation surface (i.e., do not feature totally oriented crystal growth). Additionally, the current methods of producing crystalline ceramic films are not energy efficient and are not compatible with the integration of these films with other materials (e.g., plastics and polymers). Therefore, the art is in need of a method that produces crystals with controlled alignment, in an inexpensive and energy-efficient manner, and that can be generated and used under mild pressures and temperatures.

SUMMARY OF THE INVENTION

The present invention relates to methods and compositions for the growth and alignment of crystals at biopolymeric films.

The present invention provides various methods and compositions useful for the production of oriented crystals.

In one embodiment, the present invention provides methods for growing aligned crystals at a polyrmerized film: providing at least one self-assembling monomers; a formation support; a polymerization means; and a mineral source; exposing the self-assembling monomers to the formation support to produce a film; polymerizing the film with the polymerization means to produce a template film; and introducing the mineral source to the template film to form the crystals.

In one preferred embodiment, the self-assembling monomers are selected from the group consisting of diacetylenes, acetylenes, alkenes, thiophenes, imides, acrylamides, methacrylates, vinylether, malic anhydride, urethanes, allylamines, siloxanes anilines, pyrroles, vinylpyridinium. In another preferred embodiment, the diacetylenes are selected from a group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof. In yet another preferred embodiment, the self-assembling monomers contain head groups selected from the group consisting of —COOH, —CH$_2$OH, —CH$_2$OCONHPh, —CH$_2$OCONEt, —CH$_2$CH(Et)OCONHPh, —CH$_2$)$_9$OH, —CH$_2$OCOPh, —CH$_2$OCHONHMe, —CH$_2$OTs, —CH(OH)Me, —CH$_2$OCOR$_2$, wherein R$_2$ is n-CH$_5$H$_{11}$, n-C$_7$H$_{15}$, n-C$_9$H$_{19}$, n-C$_{11}$H$_{23}$, n-C$_{13}$H$_{27}$, n-C$_{15}$H$_{31}$, n-C$_{17}$H$_{35}$, Ph, PhO, or o-(HO$_2$C)C$_6$H$_4$, —OSO$_2$R$_2$, wherein R$_2$ is Ph, p-MeC$_6$H$_4$, p-FC$_6$H$_4$, p-ClC$_6$H$_4$, pBrC$_6$H$_4$, p-MeOC$_6$H$_4$, m-CF$_3$C$_6$H$_4$, 2-C$_{10}$H7, Me—CO$_2$M, wherein M is K, H, or B a/2, —CH$_2$OCONHR$_2$ or —CH$_2$CONHR$_2$ where R$_2$ is Et, n-Bu, n-C$_6$H$_{13}$, n-C$_8$H$_{17}$, n-C$_{12}$H$_{25}$, cyclo C$_6$H$_{11}$, Ph, p-MeC$_6$H$_4$, m-MeC$_4$, o-ClC$_6$H$_4$, m-ClC$_6$H$_4$, p-ClC$_6$H$_4$, o-MeOC$_6$H$_4$, 3-Thienyl, Me, Et, Ph, 1-C$_{10}$H$_7$, Et, Ph, EtOCOCH$_2$, BuOCOCH$_2$, Me, Et, i-Pr, n-C$_6$H$_{13}$, EtOCOCH$_2$, BuOCOCH$_2$, Ph, 2,4(NO$_2$)$_2$C$_6$H$_3$OCH$_2$, or CH$_2$CH$_2$OH.

In an alternative embodiment, the mineral source comprises a supersaturated solution of dissolved mineral, while in another embodiment, the dissolved mineral is solubilized in aqueous solution. In some preferred embodiments, the mineral source is selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, C$_{60}$ buckeyballs, and C$_{70}$ buckeyballs.

In another embodiment, the formation support comprises a Langmuir-Blodgett trough, although it is contemplated that any support suitable for use to produce oriented crystals will be used in the methods of the present invention.

In alternative embodiments of the methods, the present invention further comprises the step of providing a solid support; and transferring the template film to the solid support following the polymerizing step but before the introducing the mineral source. In preferred embodiments, the solid support comprises a hydrophobized, horizontal support. In yet other preferred embodiments, the film is compressed into a monolayer having a surface tension range of approximately twenty to forty millinewtons per meter prior to the polymerization step. In further embodiments, the polymerization means is selected from the group consisting of UV-irradiation, gamma irradiation, X-ray irradiation, and electron beam exposure.

In yet another embodiment, the mineral source is introduced to the template film by placing an aliquot of the mineral source onto the template film. In yet another embodiment, the method further comprises providing a solvent and an etched film support. In some preferred embodiments, the polymerizing produces an etched film, and further comprising steps: washing the etched film with the solvent after he polymerization step, but before the introduction of the mineral source; and transferring the etched film to the etched film support after the washing but before the introduction of the mineral source. In yet additional preferred embodiments, the etched film support comprises a semiconducting or metallic substrate. In these embodiments, the semiconducting or metallic substrate is selected from the group consisting of gold, titanium oxide, and gallium arsenate.

The present invention further provides methods for growing aligned crystals on polymerized organic nanostructures, including the steps of providing: at least two compounds capable of firming a self-assembling monolayer; a solid support; a polymerization means; a template film; a mineral source; and an energetic beam emitter; placing the compounds on the solid support; etching the film with the energetic beam emitter to produce an etched film; disposing the template film on the etched film; polymerizing the template film with the polymerization means; and introducing the mineral source to the template film to produce crystals.

In one embodiment of the methods, the template film comprises self-assembling monomers selected from the group consisting of diacetylenes, acetylenes, alkenes, thiophenes, imides, acrylamides, methacrylates, vinylether, malic anhydride, urethanes, allylamines, siloxanes anilines, pyrroles, vinylpyridinium. In particularly preferred embodiments, the diacetylenes are selected from the group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof. In alternative preferred embodiments, the self-assembling monomers contain head groups selected from the group consisting of —COOH, —CH$_2$OH, —CH$_2$OCONHPh, —CH$_2$OCONEt, —CH$_2$CH(Et)OCONHPh, —CH$_2$)$_9$OH, —CH$_2$OCOPh, —CH$_2$OCHONHMe, —CH$_2$OTs, —CH(OH)Me, —CH$_2$OCOR$_2$, wherein R$_2$ is n-CH$_5$H$_{11}$, n-C$_7$H$_{15}$, n-C$_9$H$_{19}$, n-C$_{11}$H$_{23}$, n-C$_{13}$H$_{27}$, n-C$_{15}$H$_{31}$, n-C$_{17}$H$_{35}$, Ph, PhO, or o-(HO$_2$C)C$_6$H$_4$, —OSO$_2$R$_2$, wherein R$_2$ is Ph, p-MeC$_6$H$_4$, p-FC$_6$H$_4$, p-ClC$_6$H$_4$, pBrC$_6$H$_4$, p-MeOC$_6$H$_4$, m-CF$_3$C$_6$H$_4$, 2-C$_{10}$H7, or Me—CO$_2$M, wherein M is K, H, or B a/2, —CH$_2$OCONHR$_2$ or —CH$_2$CONHR$_2$ where R$_2$ is Et, n-Bu, n-C$_6$H$_{13}$, n-C$_8$H$_{17}$, n-C$_{12}$H$_{25}$, cyclo C$_6$H$_{11}$, Ph, p-MeC$_6$H$_4$, m-MeC$_6$H$_4$, o-ClC$_6$H$_4$, m-ClC$_6$H$_4$, p-ClC$_6$H$_4$, o-MeOC$_6$H$_4$, 3-Thienyl, Me, Et, Ph, 1-C$_{10}$H$_7$, Et, Ph, EtOCOCH$_2$, BuOCOCH$_2$, Me, Et, i-Pr, n-C$_6$H$_{13}$, EtOCOCH$_2$, BuOCOCH$_2$, Ph, 2,4(NO$_2$)$_2$C$_6$H$_3$OCH$_2$, or CH$_2$CH$_2$OH.

In some preferred embodiments, the mineral source comprises a supersaturated solution of dissolved mineral, while in other preferred embodiments, the dissolved mineral is solubilized in aqueous solution. In particularly preferred embodiments, the mineral source is selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, C$_{60}$ buckeyballs, and C$_{70}$ buckeyballs. In yet another embodiment, the mineral source is placed on the template film comprises placing an aliquot of the mineral source onto the template film. In another embodiment, the polymerization means is selected from the group consisting of UV-irradiation, gamma irradiation, X-ray irradiation, and electron beam exposure. In yet another embodiment, the solid support comprises a semiconducting or metallic substrate. In preferred embodiments, the semiconducting or metallic substrate is selected from a group consisting of gold, titanium oxide, and gallium arsenate. In yet another embodiment, the energetic beam emitter emits beams selected from the group consisting of ion beams and electron beams.

In further embodiments of the method, the film is compressed prior to etching. In preferred embodiments, the film is compressed so as to provide a surface tension of approximately twenty to forty millinewtons per meter.

The present invention further provides methods for growing aligned crystals on polymerized organic structures comprising the steps of providing a formation support, a polymerization means, a solvent, at least one compound capable of producing a film, and a mineral source; forming a film with the compounds capable of producing a film on the formation support; etching the film with the polymerization means to form a template film, washing the formation support with the solvent; and introducing the mineral source to the template film to form crystals. In one embodiment, the formation support is solid (e.g., a Langmuir-Blodgett trough, semiconducting or metallic substrates, etc.), while in other embodiments, the formation support comprises aqueous, liquid, fluid, or gas supports. In one preferred embodiment, the semiconducting or metallic substrate is selected from the group consisting of gold, titanium oxide, and gallium arsenate. In alternative embodiments, the film is compressed. In particularly preferred embodiments, the film is compressed so as to provide a surface tension of approximately twenty to forty millinewtons per meter.

In one embodiment, the alignment and/or structure of the crystals produced using the methods is determined. It is contemplated that any method suitable for determining the alignment and/or structure of crystals will find use in the present invention, although it is contemplated that methods such as x-ray diffraction, scanning electron microscopy, and atomic force microscopy are preferred.

In yet another embodiment of the methods, the film comprises self-assembling monomers selected from the group consisting of diacetylenes, acetylenes, alkenes, thiophenes, imides, acrylamides, methacrylates, vinylether, malic anhydride, urethanes, allylamines, siloxanes anilines, pyrroles, vinylpyridinium. In particularly preferred embodiments, the diacetylenes are selected from a group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof. In yet a further preferred embodiment, the self-assembling monomers contain head groups selected from the group consisting of —COOH, —$CH_2OH$, —$CH_2OCONHPh$, —$CH_2OCONEt$, —$CH_2CH(Et)OCONHPh$, —$(CH_2)_9OH$, —$CH_2OCOPh$, —$CH_2OCHONHMe$, —$CH_2OTs$, —CH(OH)Me, —$CH_2OCOR_2$, wherein $R_2$ is n-$CH_5H_{11}$, n-$C_7H_{15}$, n-$C_9H_{19}$, n-$C_{11}H_{23}$, n-$C_{13}H_{27}$, n-$C_{15}H_{31}$, n-$C_{17}H_{35}$, Ph, PhO, or o-($HO_2C)C_6H_4$, —$OSO_2R_2$, wherein $R_2$ is Ph, p-$MeC_6H_4$, p-$FC_6H_4$, p-$CIC_6H_4$, p$BrC_6H_4$, p-$MeOC_6H_4$, m-$CF_3C_6H_4$, 2-$C_{10}H7$, or Me—$CO_2M$, wherein M is K, H, or B a/2, —$CH_2OCONHR_2$ or —$CH_2CONHR_2$ where $R_2$ is Et, n-Bu, n-$C_6H_{13}$, n-$C_8H_{17}$, n-$C_{12}H_{25}$, cyclo $C_6H_{11}$, Ph, p-$MeC_6H_4$, m-$MeC_6H_4$, o-$CIC_6H_4$, m-$CIC_6H_4$, p-$CIC_6H_4$, o-$MeOC_6H_4$, 3-Thienyl, Me, Et, Ph, 1-$C_{10}H_7$, Et, Ph, $EtOCOCH_2$, $BuOCOCH_2$, Ph, 2,4($NO_2)_2C_6H_3OCH_2$, or $CH_2CH_2OH$. In one particularly preferred embodiment, the polymerization means comprises an electron beam.

In another preferred embodiment, the mineral source comprises a supersaturated solution of dissolved mineral, while in other preferred embodiments, the mineral source comprises mineral is solubilized in aqueous solution. In yet other embodiments, the mineral source is selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, $C_{60}$ buckeyballs, and $C_{70}$ buckeyballs. In some embodiments, an aliquot of the mineral source is placed onto the template film.

The present invention further provides aligned crystals produced according to any and all of the methods described above. In addition, the present invention provides aligned crystals present on a film support of any thickness and/or size, as well as crystals that are not associated with any discernible (i.e., complete and/or visible) film. In some embodiments, the aligned crystals are present on polymerized film. In some of these embodiments, the polymerized film comprises a plurality of self-assembling monomers, wherein the self-assembling monomers are selected from the group consisting of diacetylenes, acetylenes, alkenes, thiophenes, imides, acrylamides, methacrylates, vinylether, malic anhydride, urethanes, allylamines, siloxanes anilines, pyrroles, vinylpyridinium, and combinations thereof. In yet other embodiments, the diacetylenes are selected from the group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof, while in other embodiments, the self-assembling monomers contain head groups selected from the group consisting of —COOH, —$CH_2OH$, —$CH_2OCONHPh$, —$CH_2OCONEt$, —$CH_2CH(Et)OCONHPh$, —$(CH_2)_9OH$, —$CH_2OCOPh$, —$CH_2OCHONHMe$, —$CH_2OTs$, —CH(OH)Me, —$CH_2OCOR$, wherein $R_2$ is n-$CH_5H_{11}$, n-$C_7H_{15}$, n-$C_9H_{19}$, n-$C_{11}H_{23}$, n-$C_{13}H_{27}$, n-$C_{15}H_{31}$, n-$C_{17}H_{35}$, Ph, PhO, or o-($HO_2C)C_6H_4$, —$OSO_2R_2$, wherein $R_2$ is Ph, p-$MeC_6H_4$, p-$FC_6H_4$, p-$CIC_6H_4$, p$BrC_6H_4$, p-$MeOC_6H_4$, m-$CF_3C_6H_4$, 2-$C_{10}H7$, Me—$CO_2M$, wherein M is K, H, or B a/2, —$CH_2OCONHR_2$ or —$CH_2CONHR_2$ where $R_2$ is Et, n-Bu, n-$C_6H_{13}$, n-$C_8H_{17}$, n-$C_{12}H_{25}$, cyclo $C_6H_{11}$, Ph, p-$MeC_6H_4$, m-$MeC_6H_4$, o-$CIC_6H_4$, m-$CIC_6H_4$, p-$CIC_6H_4$, o-$MeOC_6H_4$, 3-Thienyl, Me, Et, Ph, 1-$C_{10}H_7$, Et, Ph, $EtOCOCH_2$, $BuOCOCH_2$, Me, Et, i-Pr, n-$C_6H_{13}$, $EtOCOCH_2$, $BuOCOCH_2$, Ph, 2,4($NO_2)_2C_6H_3OCH_2$, or $CH_2CH_2OH$.

In a further embodiment of the compositions of the present invention, the aligned crystals are selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, $C_{60}$ buckeyballs, and $C_{70}$ buckeyballs.

The present invention further provides totally aligned crystals. In one embodiment of the totally aligned crystals, the totally aligned crystals are selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, $C_{60}$ buckeyballs, and $C_{70}$ buckeyballs.

DESCRIPTION OF THE INVENTION

Figure 1:
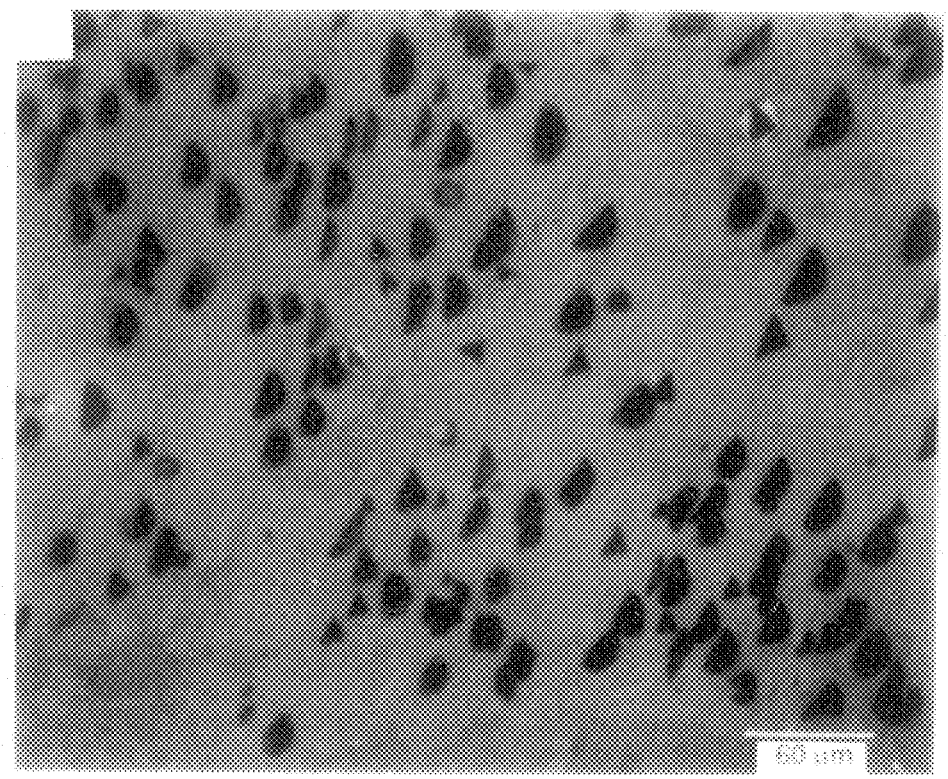
FIG. 1 is a polarized-light optical micrograph of aligned calcite crystals on p-PCA.

The present invention relates to methods and compositions for the growth and alignment of crystals at biopolymeric films, including the growth of totally aligned crystals at organic-inorganic interfaces. The polymerization of the film monomers creates a highly-ordered, structured template that facilitates the growth of totally aligned crystals. Methods that enable the growth of totally oriented crystals under mild conditions, open the door for the production of high quality single-crystal ceramic and semiconductor films on delicate substrates such as polymers and plastics. Total crystal alignment also enables the elucidation of electronic and magnetic properties of oriented crystalline materials that will lead to the development of further applications.

The synthesis of a broad range of oriented nanoparticulate and dense crystalline inorganic films is contemplated using the methods and compositions of the present invention. It is further contemplated that the choice of various crystal types provides broad applications for chemical sensors, optical wave guides, optical coatings, films with magnetic and electrical functions (e.g., magnetic information storage), semiconductor technologies, color imaging, bioprocessing, magnetic refrigeration, battery technologies, ion-exchangers, separation agents, and materials with electro-chromic and electro-optic character (e.g., niobate and tantalates). Both single phase and composite crystalline film structures are contemplated, including the combination of different material functions into a single film device. The production of crystalline nanostructures (e g., molecular wires) is also contemplated by the present invention.

A unique aspect of the present invention is the mild nature of the fabrication method. Using aqueous, room temperature methods, total alignment of crystals was achieved with self-assembling polymeric membranes. Crystal growth was initiated by placing a drop of a crystallizing solution onto the polymerized membranes coated on solid supports. The crystals produced this way were oriented not only in the direction perpendicular to the nucleating plane, but were also oriented or aligned in the plane itself (i.e., oriented about all three crystallographic axes). The extended range of the co-aligned crystals (up to 1 mm) and the total control exerted over their orientation is unprecedented in crystal growth at the in vitro organic-inorganic interface. Large domains of oriented crystals are contemplated, limited only by the domain size of the underlying polymer template.

Crystals were formed at the organic-inorganic interface by introducing a mineral source to the surface of the biopolymeric material. In preferred embodiments, the mineral source was a supersaturated mineral solution. Crystals formed at the organic-inorganic interface by the methods of the present invention were oriented in specific configurations, dictated by the type of organic film used. In one embodiment, the crystals generated by methods of the present invention can be further characterized to determine their interaction with the organic matrix and their absolute orientation and structure, although the methods of the present invention do not require such characterization. Atomic force microscopy (AFM) was used to determine the structural features of the film that induce the specific crystalline alignments. In addition, x-ray diffraction and scanning electron microscopy (SEM) were used to identify the nucleation face and the absolute orientation of the crystals with respect to the organic matrix backbone.

In one embodiment of the present invention, biopolymeric films were generated to provide an organic surface for the subsequent crystallization reactions. This template film was prepared by layering the desired matrix-forming material (e.g., self-assembling organic monomers) onto a formation support. In preferred embodiments, the formation support was a standard Langmuir-Blodgett trough and the matrix-forming material was layered onto an aqueous surface created by filling the trough with an aqueous solution. The material was then compressed and polymerized to form a biopolymeric film. In preferred embodiments, the compression was conducted in a standard Langmuir-Blodgett trough using moveable barriers to compress the matrix-forming material. Compression was carried out until a tight-packed monolayer of the matrix-forming material was formed. In preferred embodiments, the film was compressed until a surface pressure of 20–40 millinewtons (mN) per meter was obtained, although any level of compression that permits subsequent crystal growth is contemplated.

In some embodiments, the matrix-forming material, located within the formation support, was polymerized by ultra-violet irradiation. All methods of polymerization are contemplated by the present invention and include, but are not limited to, gamma irradiation, x-ray irradiation, and electron beam exposure.

In one embodiment, the polymerized biopolymeric film, maintained in the trough, was used for crystallization. A mineral source was applied between the film-water interface to initiate crystallization. Crystals were formed at the hydrophilic end groups of the template film. In preferred embodiments, the mineral source was a super-saturated mineral solution.

In some embodiments, the biopolymeric film was attached to a solid support prior to crystallization. In the most preferred embodiments, the film was attached to a hydrophobized solid support in a horizontal manner. Crystallization was carried out as described above.

In other embodiments, the present invention contemplates a variety of self-assembling monomers that are suitable for polymerization and crystal growth. Such monomers include, but are not limited to, acetylenes, diacetylenes, alkenes, thiophenes, imides, acrylamides, methacrylates, vinylether, malic anhydride, urethanes, allylamines, siloxanes anilines, pyrroles, and vinylpyridinium. Furthermore, diacetylenes with a variety of head groups are contemplated including, but not limited to —COOH, —CH$_2$OH, —CH$_2$OCONHPh, —CH$_2$OCONEt, —CH$_2$CH(Et)OCONHPh, —(CH$_2$)$_9$OH, —CH$_2$OCOPh, —CH$_2$OCHONHMe, —CH$_2$OTs, —CH(OH)Me, —CH$_2$OCOR, wherein R$_2$ is n-CH$_5$H$_{11}$, n-C$_7$H$_{15}$, n-C$_9$H$_{19}$, n-C$_{11}$H$_{23}$, n-C$_{13}$H$_{27}$, n-C$_{15}$H$_{31}$, n-C$_{17}$H$_{35}$, Ph, PhO, or o-(HO$_2$C)C$_6$H$_4$, —OSO$_2$R$_2$, wherein R$_2$ is Ph, p-MeC$_6$H$_4$, p-FC$_6$H$_4$, p-ClC$_6$H$_4$, pBrC$_6$H$_4$, p-MeOC$_6$H$_4$, m-CF$_3$C$_6$H$_4$, 2-C$_{10}$H7, Me—CO$_2$M, wherein M is K, H, or B a/2, —CH$_2$OCONHR$_2$ or —CH$_2$CONHR$_2$ where R$_2$ is Et, n-Bu, n-C$_6$H$_{13}$, n-C$_8$H$_{17}$, n-C$_{12}$H$_{25}$, cyclo C$_6$H$_{11}$, Ph, p-MeC$_6$H$_4$, m-MeC$_6$H$_4$, o-ClC$_6$H$_4$, m-ClC$_6$H$_4$, m-ClC$_6$, H$_4$, o-MeOC$_6$H$_4$, 3-Thienyl, Me, Et, Ph, 1-C$_{10}$H$_7$, Et, Ph, EtOCOCH$_2$, BuOCOCH$_2$, Me, Et, i-Pr, n-C $_6$H$_{13}$, EtOCOCH$_2$, BuOCOCH$_2$, Ph, 2,4(NO$_2$)$_2$C$_6$H$_3$OCH$_2$, or CH$_2$CH$_2$OH.

In preferred embodiments, the biopolymeric films were polymerized Langmuir-Schaefer films of 10,12-pentacosadiynoic acid (p-PCA), although other PCAs are contemplated including, but not limited to 5,7-PCA. These films produce a visible color transition when re-oriented in response to crystal formation at the organic-inorganic interface. The films were generated by spreading and compressing 10,12-pentacosadiynoic acid (PCA) on the surface of a formation support. In preferred embodiments, the formation support was a standard Langmuir-Blodgett trough and the PCA monomers were layered onto an aqueous surface created by filling the trough with an aqueous solution, although any support that facilitates the spreading and compressing of the film is contemplated by the present invention.

The diacetylene monomers (DA) were polymerized to polydiacetylene (p-PDA) using ultraviolet irradiation, although the present invention is not intended to be limited by this means of polymerization. In preferred embodiments, the ultraviolet radiation source is kept sufficiently far from the film to avoid damaging the film with heat. The crystalline morphology of the polymerized film can be readily observed between crossed polarizers in an optical microscope, although this step is not required by the present invention. The p-PCA domain size varied up to 1 mm, although it is contemplated that domains as large as approximately 3 mm can be grown (see e.g., Day and Lando, *Macromolecules* 13: 1478 [1980]). The conjugated backbone of alternating double and triple bonds (i.e., ene-yne) that was generated, gave rise to intense absorptions in the visible spectrum and led to a distinct blue appearance of the polymerized film.

The visibly blue films were then transferred to hydrophobized solid supports in a horizontal manner, such that the carboxylic acid head groups were exposed at the film-ambient interface (Charych et al., Science 261: 585 [1993]). Linear striations typical of p-PDA films can be observed in the polarizing optical microscope, although the method of the present invention does not require this step. It is not intended that the present invention be limited to the use of hydrophobized solid supports, as any solid support that facilitates the subsequent crystallization reactions is contemplated. It is also not intended that the present invention be limited to the use of solid supports, as crystals can be grown directly at the film/water interface.

Figure 2:
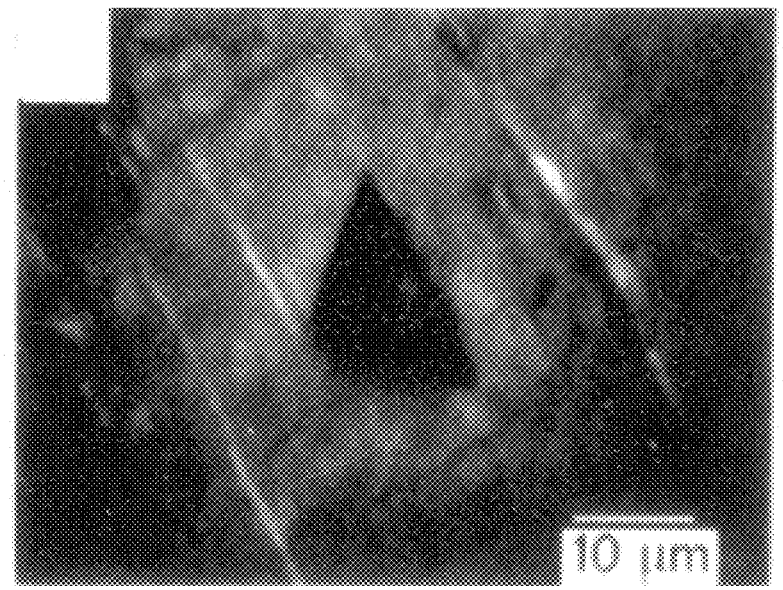
FIG. 2 is a polarized-light optical micrograph of a single calcite crystal on p-PCA.
Figure 3:
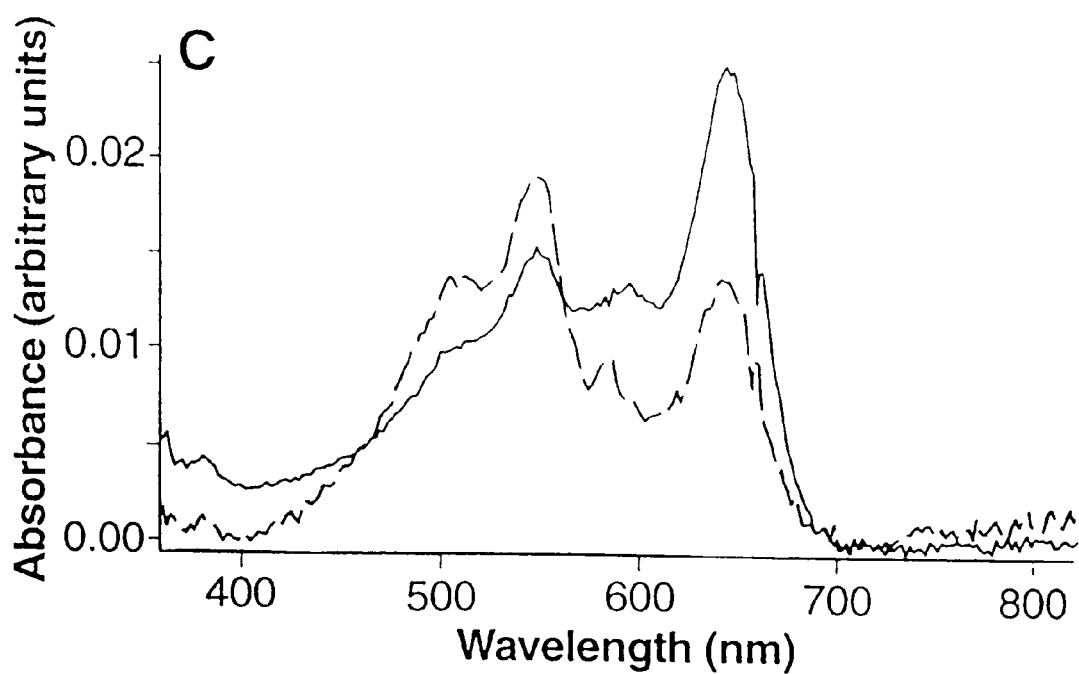
FIG. 3 is a graph representing the visible absorption spectra of p-PCA film prior to, and following, calcite crystal formation.

Crystallization was initiated by placing a mineral source on the p-PCA film. It is not intended that the present invention be limited to any particular mineral source or to the use of supersaturated mineral solutions, however in one embodiment, the mineral source was a supersaturated solution of calcite (CaCO$_3$). Calcite crystallization was initiated by placing an aliquot of supersaturated CaCO$_3$ solution on the p-PCA film. In preferred embodiments, the supersaturated solution was prepared by purging stirred aqueous suspensions of CaCO$_3$ with carbon dioxide (CO$_2$) followed by filtration, although any method of generating a supersaturated solution is contemplated. Two significant phenomena were observed upon calcite formation at the p-PCA films. First, in the regions where calcite crystals were formed, the crystals were all aligned in the same direction within the p-PCA domain boundary as shown in FIG. 1. This figure shows a polarized-light optical micrograph of aligned calcite crystals on p-PCA. The micrograph shows the presence of larger (these appear rounded because they are out of focus) and smaller (triangular) crystallites. The morphological symmetry axis of the crystals were perpendicular to and asymmetrically oriented with respect to the linear striations as shown in FIG. 2. This figure shows a polarized-light optical micrograph close-up of a single calcite crystal from FIG. 1, oriented along the p-PCA backbone striations. Second, the initially blue film changed color to red-phase polydiacetylene immediately after the onset of calcite growth as shown in the spectra of FIG. 3. This figure shows the visible absorption spectra of "blue phase" p-PCA film template before calcite formation (solid line) and "red phase" p-PCA template after the formation of calcite crystals (dashed line). The spectra are characteristic of blue-to-red transitions, with decreasing intensity at 640 nm and increasing intensity at 540 nm.

The cooperativity at the organic-inorganic interface resulted in complete alignment of calcite crystals along an identifiable structural feature of the acidic p-PCA matrix. The alignment between the phases was the outcome of two precise structural features: the periodicity match between the calcite a axis (=4.99 Å) and the polymer backbone (=5.0±0.3 Å) and the stereochemical match between the angular tilt of the carbonate molecule and the film's carboxylates. This stereochemical match took place along a direction perpendicular to the lattice match, leading to uniform inclination of the crystals within a domain boundary. Crystal formation in the absence of p-PDA at methyl-terminated surfaces resulted in uncontrolled calcite cleavage rhombohedrons with random orientations and with crystals predominantly lying on their (104) faces. This demonstrates the requirement of p-PCA for total alignment of crystals at their (012) planes.

Figure 4:
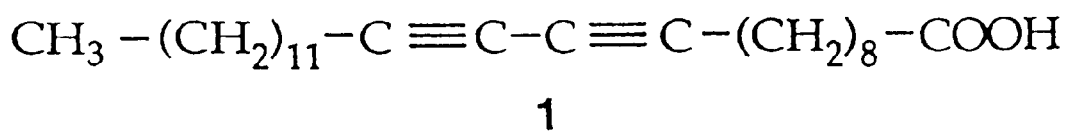
FIG. 4 is a diagram showing the structure of a 10,12-pentacosadiynoic acid monomer and its subsequent polymer.
Figure 4:
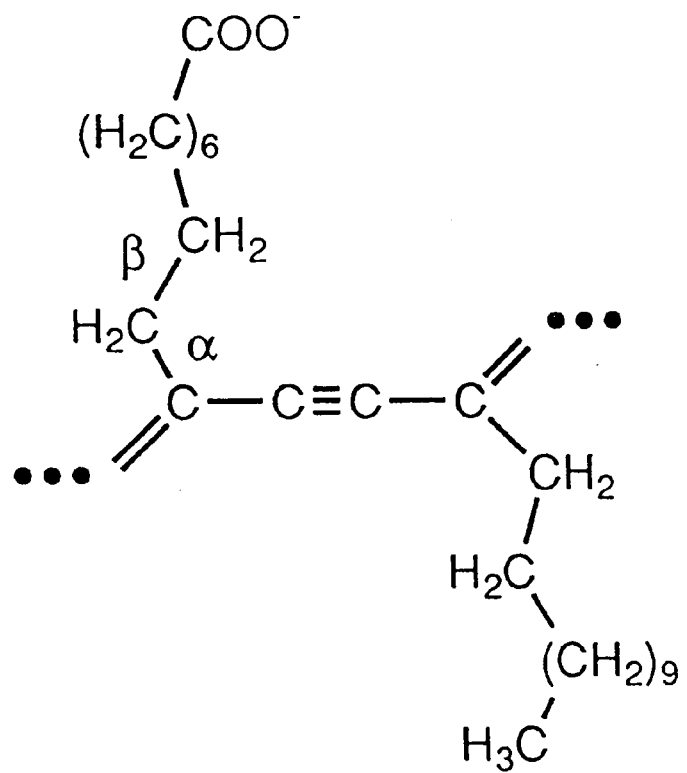

The crystals generated by methods of the present invention were further characterized to determine their interaction with the organic matrix and their absolute orientation and structure. A structural reorientation of the p-PCA matrix occurred upon calcite mineralization caused by an optimization of the stereochemical fit. The reorientation was readily observed in p-PCA as a blue-to-red chromatic transition in the polydiacetylene film. Although not required for an understanding of the invention, a more detailed analysis with Fourier transform infrared (FTIR) spectroscopy under mineralizing conditions indicated that rotation of the alkyl side chain about the single bond (C$_8$–C$_9$), β to the polydiacetylene backbone, may be responsible for the observed color transition. FIG. 4 shows the structure of a PCA monomer and its subsequent polymer.

The colors and color changes associated with p-PCA provide unique benefits above and beyond its ability to direct oriented crystal growth. Upon polymerization, the PCA monomers convert to a blue color as the p-PCA is formed, indicating completion of the polymerization reaction and the readiness of the film for subsequent crystallization reactions. Additionally, the blue to red color transition provides an easily visualized macroscopic indicator of crystal growth. The color change also demonstrates that the crystallization process alters the chemistry of the matrix itself. It is contemplated that these observations will allow optimization of film design so as to facilitate the growth of a variety of crystal types with controlled alignment.

Figure 5:
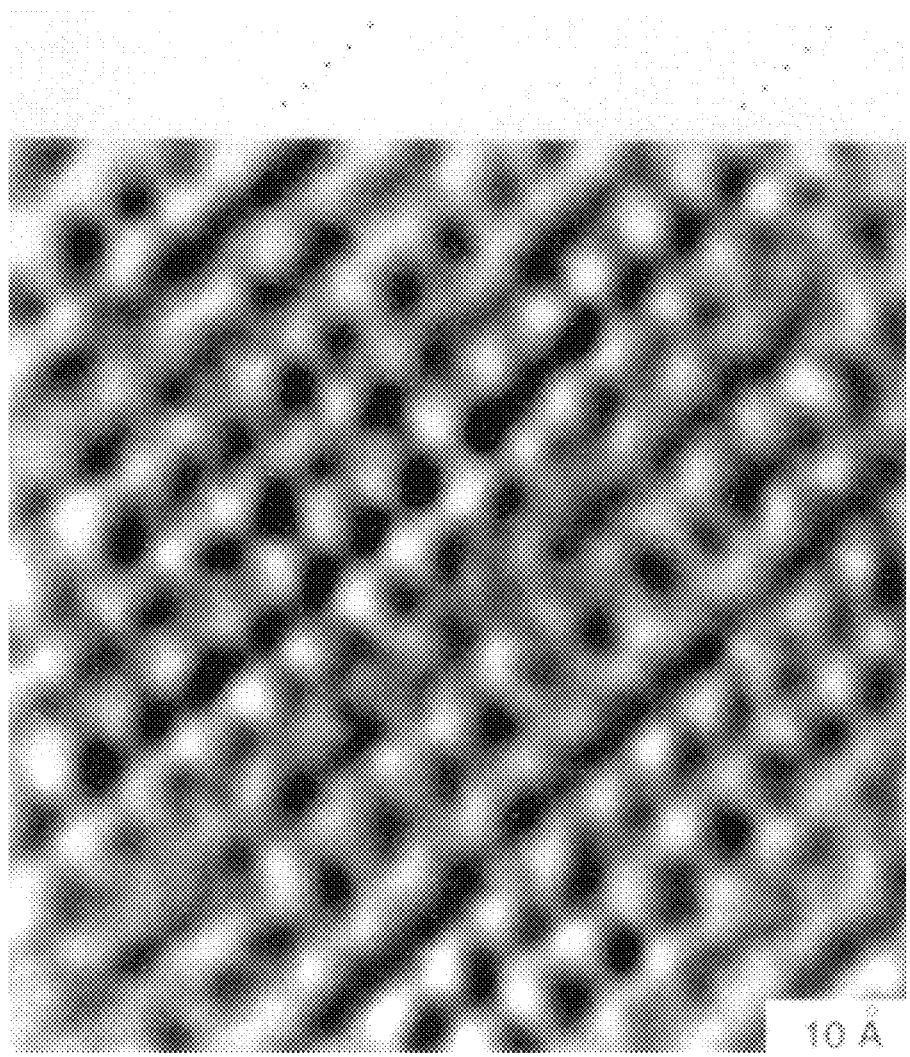
FIG. 5 is an image of the polymer backbone of p-PCA as derived by atomic force microscopy.

The structural features of the p-PCA film that induce the calcite alignment were analyzed by atomic force microscopy (AFM). By progressively increasing the magnification, the fibrous structures of the p-PCA were found to persist down to the molecular scale and correspond to the direction of the conjugated ene-yne polymer backbone as shown in FIG. 5. The dotted lines indicate the direction of the p-PCA polymer backbone. The asymmetry in the crystal alignment was therefore about the polymer backbone axis. The average periodicity along a given polymer backbone (intrabackbone), as measured from a large number of images, with the stated uncertainties taking into account the uncertainty in the xy calibration of the piezo scanner, was determined to be 4.9±0.3 Ångström (Å), in agreement with diffraction data (see e.g., Tieke and Lieser, J. Colloid Interface Sci. 88: 471 [1982]; and Lieser et al., Thin Solid Films 68: 77 [1980]) and previous AFM results (Goettgens et al., Langmuir 8: 1768 [1992]). The interbackbone distance was 5.1±0.5 Å.

Figure 6:
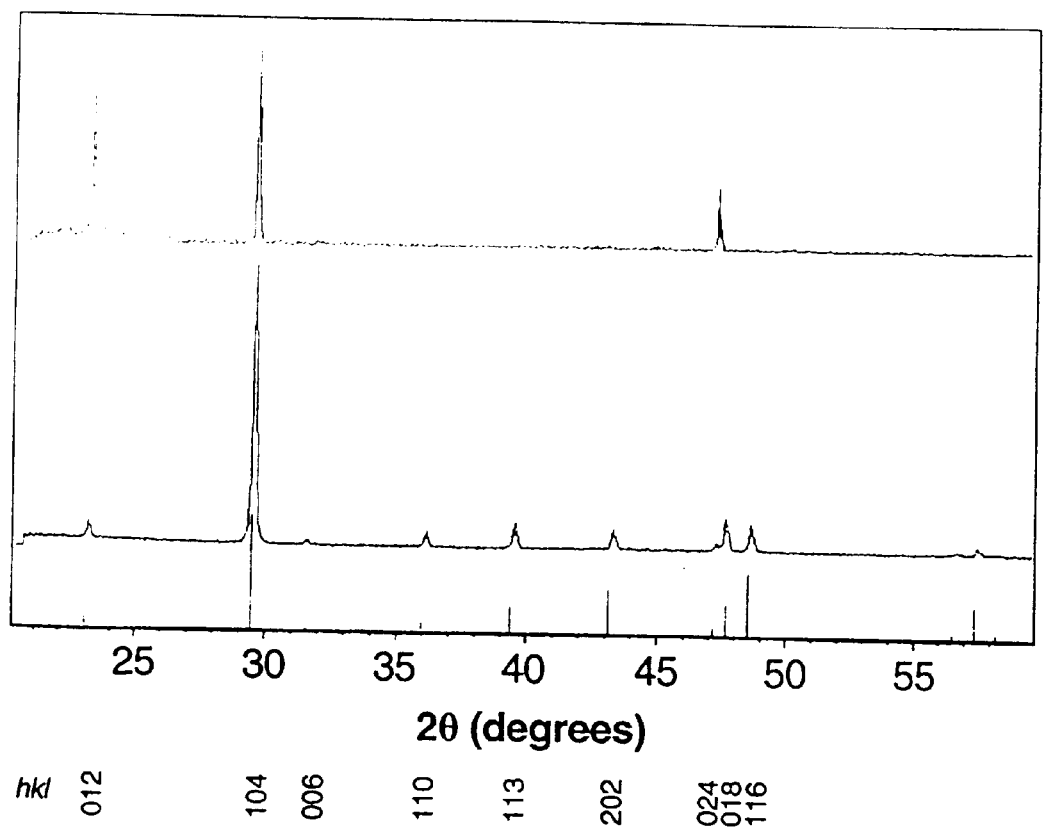
FIG. 6 is a graph of data collected by powder x-ray diffraction of calcite crystals and calcite powder on a p-PCA template.

X-ray diffraction and scanning electron microscopy (SEM) were conducted to identify of the nucleation face and the absolute orientation of the calcite crystals with respect to the previously defined p-PCA backbone direction. In the oriented calcite/p-PCA system, reflections of the type (012) were unproportionately intense, relative to randomly oriented calcite as shown in FIG. 6. The figure shows data collected by powder x-ray diffraction. The axes depict relative intensity versus Bragg diffraction angle ($2\theta$). The Miller indices hkl of crystal planes associated with the diffraction lines are indicated below each line. The top line shows diffraction from (012) uniformly oriented calcite crystals grown on p-PCA template. The middle line shows diffraction pattern from randomly oriented calcite powder. The bottom line shows the calculated positions and relative intensities of calcite powder diffraction pattern.

Figure 7:
FIG. 7 is a scanning electron micrograph of calcite crystals on p-PCA film.

All other reflections were absent (except for the (104) reflection, that was relatively weak compared to randomly oriented calcite). Hence, the (012) plane was oriented parallel to the p-PCA membrane plane. The calcite (012) direction consists of alternating layers of calcium and tilted carbonate molecules. The exact angle that the crystal faces were inclined with respect to the film plane was determined by changing the SEM microscope stage tilt as illustrated in FIG. 7. This figure shows a scanning electron micrograph of the (012) uniformly co-aligned calcite crystals. Larger crystals develop opposite faces yielding the rounded shapes seen in the optical micrograph of FIG. 1. The micrographs also enabled identification of the cleavage rhombohedron dihedral angles that determine the direction of the calcite symmetry (c) axis as portrayed in FIG. 8. This figure shows the geometric relation between the (012) face of calcite and the p-PCA template. The view is along the calcite a axis, down the polymer backbone direction, and edge-on the (012) basal plane. The alternating calcium (gray circles; dark in front, lighter toward the back) and the tilted carbonate layers characteristic of the (012) plane are depicted. The calcite unit cell is shown as a dashed, truncated rectangle, the partial structure of p-PCA film is shown, with the polymer backbone axis symbolized as ⊙. The tilt angle of the polymer alkyl chains and head groups (○) emulate the carbonate stereochemistry and are implicated in the alignment of the crystal about the backbone.

Tilt angle measurements yielded a 17±inclination between the film normal and the (01-4) face, confirming the assignment of the (012) basal plane, on the basis of the known structure of calcite (see, Lippmann, *Sedimentary Carbonate Minerals*, Springer-Verlag, Berlin [1973]). The crystal $\alpha$ axis (i.e., long direction of the (01-4) face) was perpendicular to the projected symmetry axis (c') and parallel to the polymer backbone direction as shown in FIG. 9. This figure shows a top view of a single calcite crystal with respect to the polymer backbone direction, indicating the dihedral angles. The (01-4) face corresponds to that viewed edge on in FIG. 8. Both the crystal and the p-PCA polymer had a periodicity≈5 Å along this direction. The carboxylate head groups of the p-PCA film, therefore, fit closely to the calcite crystal structure along the polymer backbone, completing the coordination sphere around the calcium ions, that would otherwise be occupied by carbonate.

In other embodiments, the present invention provides methods and compositions for the production of oriented iron oxide crystals at biopolymeric membranes. Iron oxide crystals are useful in applications as diverse as information storage, color imaging, bioprocessing, magnetic refrigeration, and ferrofluids.

As with the calcite crystals, biopolymeric films were used and prepared as described above to produce iron oxide crystals. Supersaturated iron oxide solutions were introduced to the film surface to generate oriented iron oxide crystals.

In one embodiment, p-PCA films were used as a template for iron oxide crystal growth, although it is not intended that the present invention be limited to the use of p-PCA films. The crystals produced were well-ordered rectangular crystals, oriented with the film. The long axes of the rectangles were perpendicular to the direction of the polymer backbone as deduced by atomic force microscopy.

In other embodiments, iron oxide crystal growth was enhanced by using a polymerized mixture of PCA and sulfate-terminated PCA monomers. Mixtures of 5–45 mole percent of the sulfate terminated monomers increased the film stability and rigidity. Mixtures of 33–43 mole percent sulfate terminated monomers yielded uniquely shaped iron oxide crystals, without clear alignment, that featured spindle shaped particles approximately 100 nm long and 10 nm wide. Furthermore, an underlying thin and continuous film deposit of iron oxide was oriented over long range on the PDA film that diffracted electrons as a single crystal. It is contemplated that further optimization of the organic layer will allow long-range growth of the spindle-shaped, co-aligned iron oxide crystals and other crystals of various sizes, shapes, alignments, and orientations.

Figure 10:
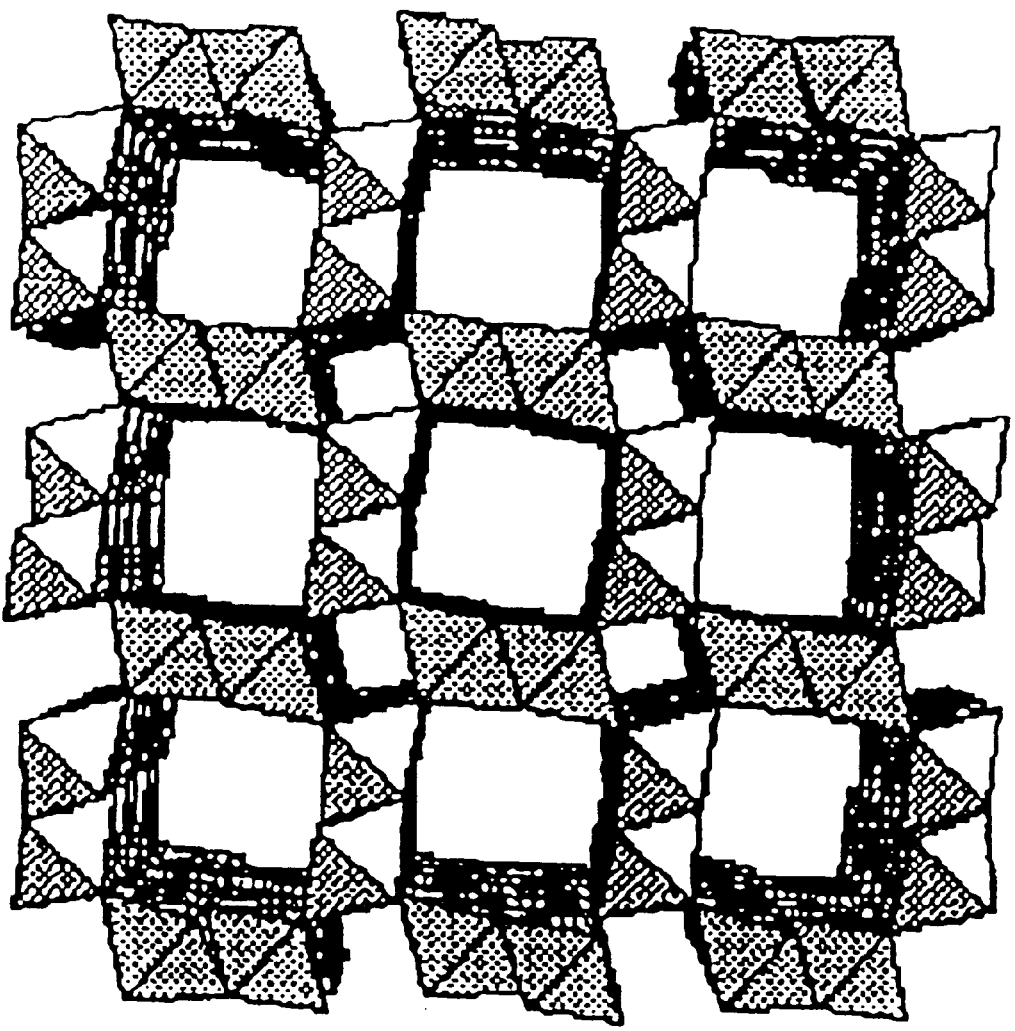
FIG. 10 is a diagram showing the structure of manganese oxide crystals looking down the c-axis.

The present invention also provides methods and compositions for the production of manganese oxide ($MnO_2$) crystals at biopolymeric membranes. Manganese oxide crystals are useful in applications such as cathode materials for primary and secondary batteries, oxidation catalysts, ion-exchangers and separation agents. Manganese oxide crystals containing tunnels in one direction (usually along the c-axis) are particularly useful for the latter two applications, due to their high selectivity. FIG. 10 shows the structure of $\alpha$-$MnO_2$ crystals, looking down the c-axis. Thin films of these tunnel structures have potential applications as rapid-response, highly selective sensors for ions or small molecules. For example, todorokite, a naturally occurring manganese oxide with 6.9 Å tunnels, readily takes up carbon tetrachloride and complexes with actinide ions. In contrast, $\alpha$-$MnO_2$, with tunnels approximately 4/9 the size of todorokite, excludes these species on the basis of size, but will selectively take up lead ions ($Pb^{2+}$) during ion-exchange processes.

The conditions that produce the best $\alpha$-$MnO_2$ crystals in solution were found to be incompatible with p-PCA films due to the high temperature and basic conditions required. A procedure was designed to circumvent these difficulties, with p-PCA films prepared as described above for calcite crystallization. The films were exposed to crystallizing solution containing manganese sulfate ($MnSO_4$), followed by addition of potassium peroxydisulfate ($K_2S_2O_8$). The presence of brown-black coloring indicated the formation of α-$MnO_2$ crystals. X-ray diffraction demonstrated the presence of α-$MnO_2$ crystals, oriented on the p-PCA film. However, the tunnels were not perpendicular to the p-PCA substrate. It is contemplated that optimization of the deposition process will produce evenly deposited films in the desired orientation (i.e., the c-axis normal to the PCA layer). It is further contemplated that organic deposits that form size-selective cavities can be generated.

By adjusting solution and substrate chemistries, oriented thin films or nanoparticles of ceramics (e.g., tin oxide and aluminum oxide), and semiconductors (e.g., cadmium sulfide and cadmium selenide), can be synthesized by the methods of the present invention. Additionally, the present invention contemplates the growth of a variety of other crystal types at biopolymeric films including, but not limited to, minerals (e.g., titanium oxide, indium phosphate, calcium phosphate, hydroxy apatite, mercury sulfide, and tungsten oxide), metals (e.g., nanocrystalline gold, silver, platinum), and non-minerals (e.g., carbon nanotubes, boron nanotubes, and $C_{60}$ or $C_{70}$ buckeyballs).

The present invention also provides methods and compositions suitable for the generation of composite crystalline films. Composite films allow for multiple types or forms of crystals to be generated on a single film. The composite films are created by producing or combining distinct film regions containing specific organic monomers or mixtures of organic monomers. Such composite films find use in many applications, including, but not limited to, devices with magnetic and piezoelectric properties, arrays of selective sensor elements, and bio-sensitive organic "fillers" dispersed into inorganic transducer components.

The present invention also provides methods and compositions for the creation of nano-crystalline structures with totally aligned crystals, including crystalline polymer wires. In one embodiment, a self-assembling monolayer (e.g., octadecyltrichlorosilane (OTS) or octadecyltriethoxyacetylene) is generated on a substrate. In preferred embodiments, the substrate is a semiconducting or metallic substrate (e.g., gold, titanium oxide, and gallium arsenate). The monolayer is then etched using an energetic beam to re-expose the underlying substrate surface. In preferred embodiments, the energetic beam is an ion beam or an electron beam, although any energy beam capable of etching the monolayer is contemplated. The desired film material is then deposited onto the surface upon which it will associated with the non-etched regions, and is polymerized. Crystallization is initiated, with crystal growth only occurring on the patterned region representing the non-etched portion. The etching pattern can be designed to create crystalline wires or any other desired shape. The present invention contemplates the production of a variety of oriented crystal types within the etched areas, controlled by the choice of biopolymeric material. In preferred embodiments, p-PCA is the biopolymeric material, although it is not intended that the present invention be limited to the use of p-PCA films.

The present invention also provides alternative methods and compositions to produce nano-crystalline structures with totally aligned crystals. Biopolymeric films generated on desired substrates, including, but not limited to, such substrates as semiconducting or metallic substrates (e.g., gold, titanium oxide, and gallium arsenate), are polymerized by an energy beam only in certain regions or lines. In preferred embodiments, the energy beam is an electron beam. The substrate and film are then washed with solvent to remove unpolymerized monomer, leaving the polymerized region. Crystallization is then initiated, with crystal growth only occurring on the patterned region. The polymerization pattern can be designed to create crystalline wires or any other desired shape. The present invention contemplates the production of a variety of oriented crystal types within the etched areas, depending on the choice of biopolymeric material. Although it is not intended that the present invention be limited to p-PCA, in preferred embodiments, p-PCA is used.

The present invention also contemplates the growth of totally oriented crystals are biopolymeric membranes other than flat films. PDAs can be arranged into vesicles or liposomes, providing the possibility of crystallizing all of the above mentioned crystals types into size-confined spaces.

Definitions

As used herein, the term "films" refers to any material deposited or used in a thin section or in a layer form. Specifically, film can refer to the biopolymeric or "templating" film used to initiate crystal growth. The phrase "dense crystalline ceramic films" refers to densely packed inorganic or crystalline films. For example, the crystals grown on a compressed monolayer of polymerized diacetylene monomers are a dense crystalline ceramic film. The term "template film" refers to a film used as a surface or nucleation template for a reaction. For example, a template film can be used as a nucleation template for crystallization reactions.

As used herein, the terms "nanoparticulate film" and "particulate film" refer to small (typically microscopic) defined sections of film that exhibit a certain size and shape (e.g., a polymer wire).

As used herein, the term "nano-crystalline structures" refers to films, and/or the crystals grown on the films, that are patterned into, or designed as, microscopic structures.

As used herein, the term "surfactant molecular assemblies" refers to an assembly of surface active agents that contain chemical groups with opposite polarity, form oriented monolayers at phase interfaces, form micelles, and have detergent, foaming, wetting, emulsifying, and dispersing properties.

As used herein, the term "self-assembling monomers" refers to molecules that spontaneously associate to form molecular assemblies. In one sense, this can refer to surfactant molecules that associate to form surfactant molecular assemblies. "Self-assembling monolayers" refer to monolayers that are composed of self-assembling molecules.

As used herein, the term "single phase crystalline film structure" refers to a homogenous film (i.e., a film containing only one type of molecule or a homogenous mixture of molecules). The term "composite phase crystalline film structure" refers to a heterogenous film (i.e., a film containing more than one type of molecule or structure, whereby the molecules' and structures' compositions are not homogenous throughout the entire film).

As used herein, the terms "organic matrix" and "biological matrix" refer to collections of organic molecules that are assembled into a larger multi-molecular structure. Such structure can include, but are not limited to, films, monolayers, and bilayers. "Organic polymetric matrix" refers to organic matrices whereby some or all of the molecular constituents of the matrix are polymerized.

As used herein, the term "biopolymeric films" refers to polymerized organic films that are used in a thin section or in a layer form. Such films can include, but are not limited to, monolayers and bilayers. Biopolymeric films can mimic biological cell membranes (e.g., in their ability to nucleate and control crystal growth).

As used herein, the term "organic monolayer" refers to a thin film comprised of a single layer of carbon-based molecules. Such monolayers can be comprised of polar molecules whereby the hydrophobic ends all line up at one side of the monolayer. The term "monolayer assemblies" refers to structures comprised of monolayers.

As used the term "multilayer" refers to structures comprised of two or more monolayers. The individual monolayers may chemically interact with one another (e.g., covalent bonding, ionic interactions, van der Waals' interactions, hydrogen bonding, hydrophobic or hydrophilic assembly, and stearic hindrance) to produces a film with unique properties, different from those of the monolayers alone.

As used herein, the term "vesicle" refers to a small enclosed structures. Often the structures are membranes composed of lipids, proteins, glycolipids, steroids or other components associated with membranes. Vesicles can be naturally generated (e.g., the vesicles present in the cytoplasm of cells that transport molecules and partition specific cellular functions) or can be synthetic.

As used herein, the term "organic template" refers to any organic molecule or assembly of organic molecules suitable for use as a surface or foundation for a chemical reaction (e.g., crystallization) or for assembling material. The organic template initiates and directs the crystallization.

As used herein, the term "nucleation surface" refers to a surface (e.g., film or organic template) that provides a starting point or center for a reaction. In crystallography, a nucleation surface refers to a surface that initiates the formation of crystals. As used herein, the term "plane of nucleation" refers to the plane defined by the template surface upon which nucleation occurs.

As used herein, the term "substrate" refers to the solid support onto which a film is deposited.

As used herein, the term "solid interfaces" refers to the portion of a solid substance that is in contact with another substance (e.g., the face of a crystal in contact with an organic molecule that initiated its formation).

As used herein, the term "biomineralization" refers to the nucleation, growth, and morphological development of inorganic species (e.g., crystals) assembled on organic molecules. Biomineralization encompasses both natural processes of mineralization on organic molecules (e.g., in vivo) and synthetic processes (e.g., in vitro).

As used herein, the phrase "organic-inorganic interactions" refers to reactions or chemical interactions (e.g., covalent bonding, ionic interactions, van der Waals' interactions, hydrogen bonding, hydrophobic or hydrophilic assembly, and stearic hindrance) between organic and inorganic samples.

As used herein, the term "organic-inorganic interface" refers to the area between, and the contacted regions between, inorganic (e.g., crystal) and organic (e.g., biopolymeric film) structures or moieties.

As used herein, the term "film-ambient interface" refers to a film surface exposed to the ambient environment or atmosphere (i.e., not the surface that is in contact with a solid support).

As used herein, the term "alignment" refers to the three-dimensional spacial relationship of a substance with its environment. In crystallography, the term alignment refers to the orientation of the defined physical characteristics (e.g., faces, planes, and axes) of a crystal with its environment.

As used herein, the phrases "total alignment" and "totally oriented crystal" refer to the orientation of crystals along an identifiable structural feature of the template and thus oriented about all three crystallographic axes (e.g., along the backbone of p-PCA film).

As used herein, the term "crystals" refers to a discrete solid particle bounded by definite faces that intersect at definite angles and that contain symmetry characteristics. Crystals are composed of ordered arrangements of atoms or molecules and can include, but are not limited to biological organic crystals (e.g., crystallized protein) and inorganic crystals. "Inorganic crystals" are composed of atoms other than carbon, although carbides, carbonates, carbonyls and cyanides are often considered inorganic and are encompassed within this definition. As used herein, the term "crystalline morphology" refers to the configuration and structure of crystals that can include, but are not limited to, crystal shape, orientation, texture, and size. "Crystallization" refers to the removal of solid from solutions by altering the conditions of the solution (e.g., cooling, increasing solute concentration, and induction by organic molecules) so that precipitation of crystal occurs. Crystallization can occur and be initiated on organic surfaces. "Crystal growth" and "crystal production" refer to the use of crystallization to produce crystals. "Crystal alignment" and "oriented crystal growth" refer to the preferential growth of crystals with similar or identical morphologies (e.g., orientations) or the growth of crystals with a specific alignments. "Crystallizing solution" refers to the solution containing solute that is suitable for crystal production. "Oriented crystalline materials" refers to crystals that share common morphology and spatial orientation and materials that contain such crystals.

As used herein, the, term "crystal axes" refers to the three dimensional references (i.e., x, y, and z axes) that define the repeat unit in a crystal. The axes are defined differently for each crystalline symmetry class.

As used herein, the term "crystal lattice" refers to the regular three-dimensional arrangement of atoms in a crystal.

As used herein, the terms "molecular orientation" and "absolute orientation" refer to the alignment of a crystal relative to a reference point or substance.

As used herein, the term "material fabrication industry" refers broadly to industries with interests in the material sciences.

As used herein, the term "etching" refers to the cutting, impressing, or imprinting of a design onto a sample. Etching of films (i.e., the production of an "etched film") comprises the destruction of film to expose or design the template in a manner that creates patterns. Etching also comprises the polymerization of film material to create patterns. The term "etched film support" refers to any support used as a surface for the etching process.

As used herein, the terms "standard trough" and "standard Langmuir-Blodgett trough" refer to a device, usually made of teflon, that is used to produce Langmuir films. The device contains a reservoir that holds an aqueous solution and moveable barriers to compress film material that are layered onto the aqueous solution. The use of Langmuir-Blodgett troughs are well described in the literature (See e.g., Roberts, *Langmuir-Blodgett Films*, Plenum, N.Y., [1990]).

As used herein, the term "spreading agent" refers to any medium, although typically a volatile organic solvent, used to layer film material onto a surface.

As used herein, the term "rhombohedron" refers to an alternative crystallographic representation of the trigonal systems whereby the rhombohedral unit cell contains three equal axes equally at an angle other than 90°. Calcite (CaCO$_3$) is an example of a rhombohedral crystal. As used herein, the term "cleavage rhombohedron" describes the morphology of crystals. For calcite, a cleavage rhombohedron is made of (104) type crystal faces (i.e., which is not the same rhombohedral unit cell of calcite).

As used herein, the terms "facet" and "face" refer to a small face of a crystal which is a flat surface of the crystal exterior that can be defined by "hlk indices" (i.e., "Miller indices") to indicate the orientation with respect to the crystal unit cell. Crystal faces can have different chemistries according to the chemical groups that are exposed on their surfaces and the crystal symmetry. The terms "104," "102," and "10-4" refer to faces generated by specifically defined planes. The "–" before a number refers to an inversion coordinate used to define the plane.

As used the term "morphological symmetry axis" refers to an imaginary line drawn through a crystal in such a way that, on rotating the crystal about the line, the crystal demonstrates an identical aspect more than once in a complete rotation.

Figure 8:
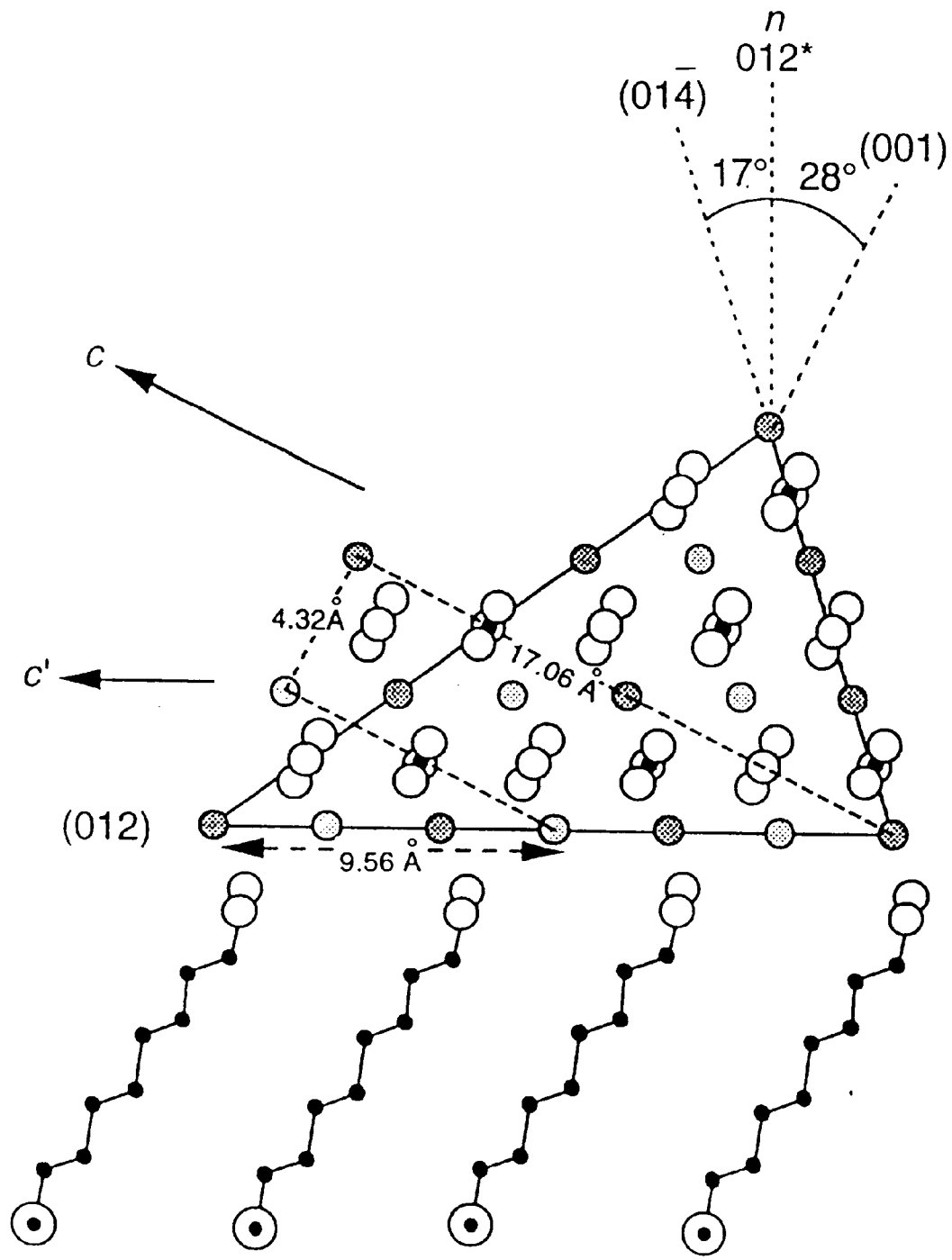
FIG. 8 is a diagram showing the geometric relation between the (012) face of calcite and the p-PCA template.
Figure 9:
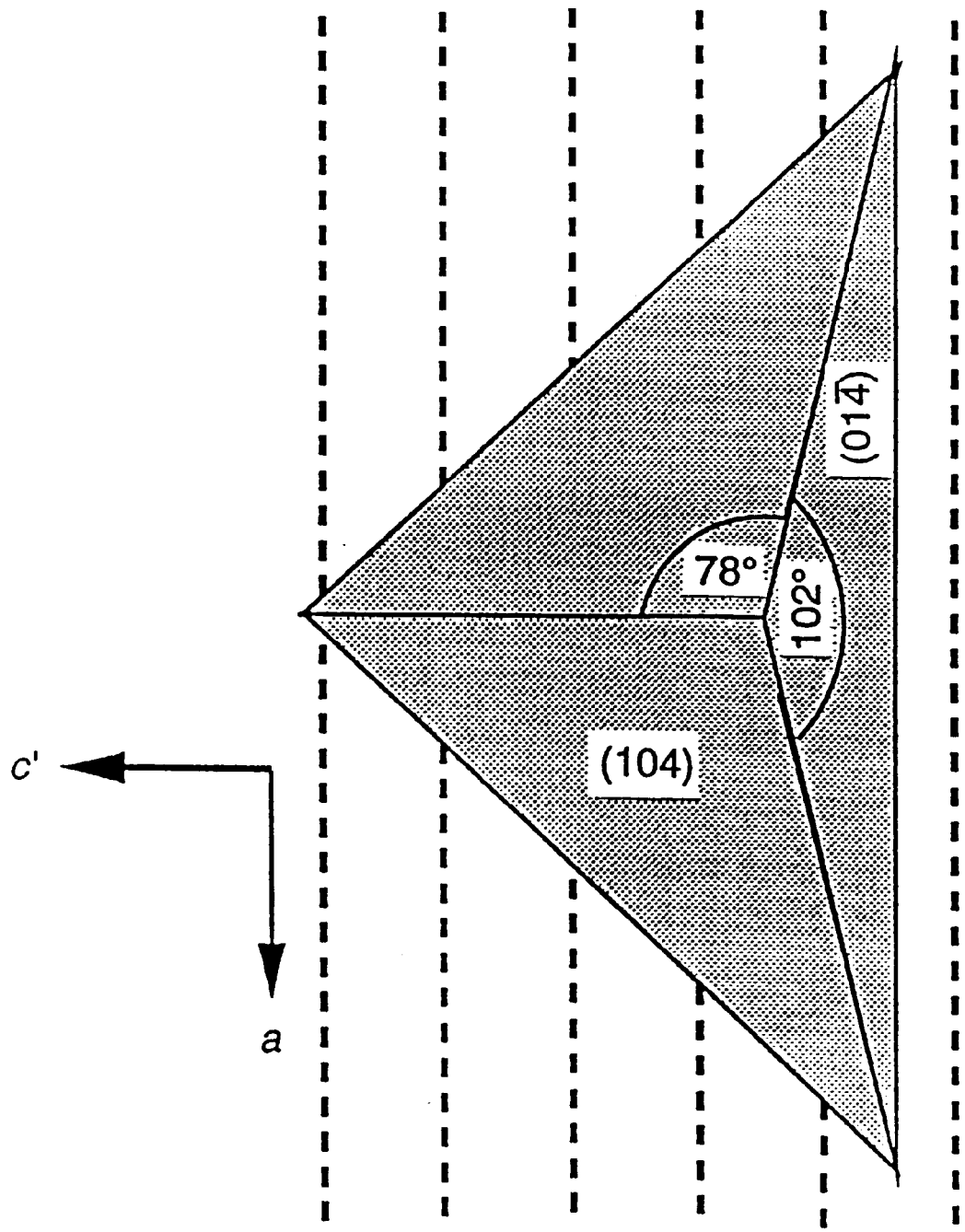
FIG. 9 is a diagram showing the top view of a single calcite crystal on p-PCA film.

As used the phrase "perpendicular to and asymmetrically oriented with respect to the linear striations" refers to the alignment of crystals, with respect to the linear striations present in polydiacetylene film, as represented by FIGS. 2, 8 and 9.

As used herein, the term "lattice match" refers to the identity of molecular distances between a crystal plane and the organic template, along one or more directions within these planes.

Crystals contain atoms, molecules and ions that are arranged in regular patterns in three dimensions (a "lattice"). Starting from an arbitrary origin within the crystal, one can proceed in any direction and arrive at a point with the same environment as the point of origin. The distance traveled is referred to as the "repeat difference." This operation can also be performed in two other directions. The lines travelled are referred to as the "x," "y," and "z," "axes" with repeat distances "a," "b," and "c." These axes define a "parallelopiped" that encompasses the smallest volume which contains a representative portion of the crystal structure. As used herein, a characteristic parallelopiped is called the "unit cell." The choice of axes in a crystal is determined by the positions of the symmetry elements (e.g., crystals with trigonal symmetry such as calcite contain a=b and c axes with one 3-fold axis perpendicular to other axes of symmetry).

As used herein, the term "stereochemical match" refers to the spatial relationship of atoms in molecules and complexes between two samples.

As used herein, the terms "symmetry reduction" refers to a chemical or physical barrier that restricts growth in one or more directions to allow oriented growth. For example, one could expect that calcite crystals would have been evenly distributed about the p-PCA lineation direction. However, they were all pointing at the same direction and thus one cannot apply "mirror symmetry" along the plane. This observation extends down to the molecular level.

As used herein, the term "symmetry" refers to the operators (e.g., axes, planes, identity operator, and center) that give repetition and pattern to molecules and lattices.

As used herein, the term "nucleation face type" refers to the face from which crystal growth is started (i.e., the face that is in planar contact with the template).

As used herein, the term "asymmetric" refers to a quality of an event or state of being (e.g., crystal growth and orientation) that lacks symmetry.

As used herein, the phrases "normal to the membrane plane" and "perpendicular to the nucleating plane" refer to an alignment whereby a certain symmetry aspect is oriented with the plane of the template (e.g., the face of a crystal in contact with the nucleation template).

As used herein, the term "long-range two-dimensional order" refers to the homogenous organization of a sample in two dimensions over a large area (e.g., the homogenous structure of the surface of a p-PDA film extending for distances).

As used herein, the term "domain boundary" refers to the boundaries of an area in which the template molecules are homogeneously oriented. For example, a domain boundary can be the physical structure of periodic, regularly arranged polydiacetylene material (e.g., striations, ridges, and grooves) that direct and align crystals. Within a given domain the PDA is periodic and regular and the crystals are aligned.

As used herein, the term "domain size" refers to the typical length between domain boundaries.

As used herein, the term "biological organisms" refers to any carbon-based life forms.

As used herein, the term "highly acidic" refers to any substance, molecule, or molecular group that has a pH less than 7.0 and typically less than 5.0.

As used herein, the term "hydrophilic head-group" refers to ends of molecules that are substantially attracted to water by chemical interactions including, but not limited to, hydrogen-bonding, van der Waals' forces, ionic interactions, or covalent bonds.

As used herein, the term "membrane" refers to, in its broadest sense, a thin sheet or layer of pliable substance. The term membrane includes all biomembranes, which are structures bounding cells or organelles that contain lipids, proteins, glycolipids, and steroids. The term "polymerized membrane" refers to membranes that have undergone partial or complete polymerization. "Polymerization" includes any process that results in the conversion of small molecular monomers into larger molecules consisting of repeated units.

As used herein, the term "macromolecules" refers to molecules of high molecular weight, typically greater than 10 000. Macromolecules can also refer to structures such as crystals that can be regarded as being one large molecule.

As used herein, the term "intercalation" refers to the process of interposing or inserting something between two or more objects. For example, ethidium bromide can intercalate between nucleotides within a DNA molecule, while membrane components can intercalate into the crystal lattice of forming crystals.

As used herein, the term "minerals" refers to any homogeneous inorganic material. The term "mineralization" refers to the introduction of minerals onto or into a sample (e.g., onto film, membranes, and monolayers).

As used herein, the term "in vitro" refers to an artificial environment and to processes or reactions that occur within an artificial environment. In vitro environments can consist of, but are not limited to, test tubes and cell culture. The term "in vivo" refers to the natural environment (e.g., an animal or a cell) and to processes or reaction that occur within a natural environment.

As used herein, the, term "in situ" refers to processes, events, objects or information that are present within the context of their natural environment.

As used herein, the terms "material" and "materials" refer to, in their broadest sense, any composition of matter. Often, the terms are used to describe substances that are of interest to material scientists and industries.

As used herein, the term "xy calibration" refers to the calibration of an instrument within a horizontal plane.

As used herein, the term "fourier transform infrared (FTIR) spectroscopy" refers to a method whereby the fourier transform techniques are used to analyze the interaction of infrared radiation with a sample.

As used herein, the term "electron diffraction" refers to a method whereby a beam of electrons interacts with atoms or molecules and are diffracted and detected. The method is used to study the molecular structure of samples.

As used the term "aqueous" refers to a liquid mixture containing water, among other components.

As used herein, the term "supersaturated solution" refers to a solution that contains solute concentrations greater than would typically be allowed at a given temperature and pressure without crystallization and/or precipitation. Supersaturation can be achieved by supercooling, filtration, and other techniques.

As used herein, the term "room temperature" refers, technically, to temperatures approximately between 20 and 25 degrees Celsius. However, as used generally, it refers to the any ambient temperature within a general lab area while an experiment is taking place.

As used herein, the term "solid support" refers to a solid object or surface upon which a sample is layered or attached. "Hydrophobized solid support" refers to a solid support that has been chemically treated or generated so that it attracts hydrophobic entities and repels water.

As used herein, the term "formation support" refers to any device or structure that provides a physical support for layering and/or compressing films.

As used herein, the, term "10,12-pentacosadiynoic acid" refers to the compound with the following chemical formula: $CH_3-(CH_2)_{11}-C\equiv C-C\equiv C-(CH_2)_8-COOH$.

As used herein, the term "diacetylene monomers" refers to single copies of hydrocarbons containing two alkyne linkages (i.e., carbon/carbon triple bonds).

As used herein, the term "sulphate terminated" refers to any molecule containing an anionic or co-ordinated oxy-sulphur species at one or more of the molecular ends.

As used herein, the term "piezoelectric properties" refers to properties associated with the electric charge generated in anisotropic crystals when subjected to stress.

As used herein, the term "ultraviolet irradiation" refers to exposure to radiation with wavelengths less than that of visible light (i.e., less than 360 nM) but greater than that of X-rays (i.e., greater than 0.1 nM). Ultraviolet radiation possesses greater energy than visible light and is therefore, more effective at inducing photochemical reactions.

As used herein, the term "solid-state" refers to reactions involving one or more rigid or solid-like compounds.

As used herein, the term "regularly packed" refers to the periodic arrangement of molecules within a compressed film.

As used the term "conjugated backbone" refers to the ene-yne polymer backbone of p-PCA films that, on a macroscopic scale, appears as physical ridges or striations. The term "polymer backbone axis" refers to an imaginary line that runs parallel to the conjugated backbone. The terms "intrabackbone" and "interbackbone" refer to the regions within a given polymer backbone and between polymer backbones respectively. The backbones create a series of lines or "linear striations," that extend for distances along the template surface.

As used herein, the term "bond" refers to the linkage between atoms in molecules and between ions and molecules in crystals. The term "single bond" refers to a bond with two elections occupying the bonding orbital. Single bonds between atoms in molecular notations are represented by a single line drawn between two atoms (e.g., $C_8-C_9$). The term "double bond" refers to a bond that shares two electron pairs. Double bonds are stronger than single bonds and more reactive. The term "triple bond" refers to the sharing of three electron pairs. As used herein, the term "ene-yne" refers to alternating double and triple bonds.

As used the term "absorption" refers, in one sense, to the absorption of light. Light is absorbed if it is not reflected or transmitted from a sample. Samples that appear colored have selectively absorbed all wavelengths of white light except for those corresponding to the visible color that is seen.

As used the term "visible spectrum" refers to light radiation that contains wavelengths from 360 nm to approximately 800 nm.

As used herein, the term "chromatic transition" refers to the change in light absorption of a sample, whereby there is a detectable color change associated with the transition. This detection can be accomplished through various means including, but not limited to, optical observation and spectrophotometry.

As used herein, the term "carboxylic acid head groups" refers to organic compounds containing one or more carboxyl (—COOH) groups located at, or near, the end of a molecule. The term carboxylic acid includes carboxyl groups that are either free or exist as salts or esters.

As used herein, the term "calcite" refers to forms of calcium carbonate ($CaCO_3$). Calcite is the Molecular basis for limestone, shell, marble, and chalk and is the most stable form of (calcium carbonate. Calcite crystals have common names such as, but not limited to, calcspar, Iceland spar, and dogtoothe spar.

As used herein, the term "carbonate" refers to salts of the weak acid group $H_2CO_3$. Carbonates comprise many common minerals and compounds including, but not limited to, calcium, magnesium, sodium, and zinc carbonates. The term carbonate also includes hydrogen carbonates (i.e., compounds that contain the $[HCO_3]^-$ ion) and basic carbonates (e.g., $2PbCO_3 \cdot Pb(OH)_2$).

As used herein, the term "filtration" refers to the process of separating a samples from one another. In one sense filtration refers to the separation of solids from liquids or gasses by the use of a membrane of medium.

As used herein, the term "methyl-terminated surfaces" refers to the molecules that have a methyl (—$CH_3$) group at one or more of their ends exposed at the surface.

As used herein, the term "alkyl side chain" refers to aliphatic hydrocarbons of the general formula $C_nH_{2n-1}$ that are covalently linked to a parent molecule.

As used herein, the term "head groups" refers to molecular groups that are present at the ends of molecules.

As used herein, the term "sample" is used in its broadest sense. In one sense it can refer to a crystallized product. In another sense, it is meant to include a specimen or culture; on the other hand, it is meant to include biological and environmental samples. Biological samples include blood products, such as plasma, serum and the like. Biological samples may be animal, including human, fluid, solid or tissue. Environmental samples include environmental material such as surface matter, soil, water, crystals and industrial samples. These examples are not to be construed as limiting the sample types applicable to the present invention.

Experimental

The following examples are provided in order to demonstrate and further illustrate certain preferred embodiments and aspects of the present invention and are not to be construed as limiting the scope thereof.

In the experimental disclosure which follows, the following abbreviations apply: M (Molar); mM (millimolar); µM (micromolar); mol (moles); mmol (millimoles); µmol (micromoles); nmol (nanomoles); pmol (picomoles); g (grams); mg (milligrams); µg (micrograms); ng (nanograms); l or L (liters); ml (milliliters); µl (microliters); m (meters); cm (centimeters); mm (millimeters); µm (micrometers); nm (nanometers); mN (millinewton); ° C. (degrees Centigrade); $CaCO_3$ (calcium carbonate); $(NH_4)_2CO_3$ (ammonium carbonate); NaOH (sodium hydroxide); α-$MnO_2$ (alpha manganese oxide); $HNO_3$ (nitric acid); $Na_2MnO_4$ (sodium manganate); $H_2O_2$ (hydrogen peroxide); KOH (potassium hydroxide); $MnSO_4$ (manganese sulphate); $H_2SO_4$ (sulfuric acid); FeIII (ferric +3 iron); FeII (ferrous +2 iron); PDA (diacetylene monomer); p-PDA (polymerized diacetylene); OTS (octadecyltrichlorosilane); Hz (Hertz); LB (Langmuir-Blodgett); SEM (scanning electron microscope); STM (scanning/tunneling microscope); TOF-SIMS (Charles Evans & Associates time-of-flight secondary ion mass spectrometer); HgCdTe (mercury, cadmium, tellurium); $CO_2$ (carbon dioxide); Sigma (Sigma Chemical Co., St. Louis, Mo.); Perkin-Elmer (Perkin-Elmer Co., Norwalk, Conn.); Fisher (Fisher Scientific, Pittsburgh, Pa.); and Farchan Laboratories (Farchan Laboratories, Inc., Gainesville, Fla.); Park Scientific Instrument (Park Scientific Instruments, Sunnyvale, Calif.); and Belico Glass (Bellco Glass Inc., Vineland, N.J.).

EXAMPLE 1

Formation of Polydiacetylene Layers

Polydiacetylene films were formed in a standard Langmuir-Blodgett trough (See e.g., Roberts, *Langmuir Blodgett Films*, Plenum, N.Y. [1990]). The trough was filled with water to create, a surface for the film. Distilled water was purified with a millipore water purifier with the resistivity of 18.2 M-Ohm. Diacetylene monomers (e.g., 10,12-pentacosadiynoic acid [Farchan Laboratories], sulfate-derivated 10,12-pentacosadiynoic acid, various ratios of 10,12-pentacosadiynoic acid and sulfate-derived 10,12-pentacosadiynoic acid, or other self assembling monomers), dissolved in a solvent spreading agent (e.g., spectral grade chloroform [Fisher]), were layered onto the aqueous surface with a syringe, to form a continuous film. Monomers prepared in the concentration range of 1.0 to 2.5 mM, were kept at a temperature of 4° C. in the dark, and were allowed to equilibrate at room temperature before being used in experiments.

Once produced on the water surface, the film was physically compressed using moveable barriers to form a tightly-packed monolayer of the self-assembling monomers. The monolayer was compressed to its tightest packed form (i.e., until a film surface pressure of 20–40 mN/m was achieved). Following compression, the film was polymerized.

Ultraviolet irradiation was used to polymerize the monomers, although other means of polymerization are available (e.g., gamma irradiation, x-ray irradiation, and electron beam exposure). Pressure was maintained on the film throughout the irradiation process. An ultraviolet lamp was placed 20 cm or farther from the film and trough. It was found that if the lamp is placed closer to the film damage to the diacetylene film may occur due to the effects of heating the film. The film then was exposed to ultraviolet light with a wavelength of approximately 254 nm for approximately one minute. The polymerization was confirmed by observing the blue color acquired upon p-PCA formation and detecting the linear striations typical of p-PCA films with a polarizing optical microscope.

EXAMPLE 2

Formation of Crystallization at PDA Films

Crystallization can occur at either the film/water interface or on film that has been transferred to a solid support. For crystallization at the film/water interface, a supersaturated solution was introduced underneath the film layer. For crystallization on a solid support, the biopolymeric film was transferred to a glass slide or other solid support previously coated with a hydrophobizing agent such as octadecyltrichlorosilane (OTS) or octadecyltriethoxyacetylene. The floating polymerized film was lifted by the horizontal touch method onto the slide using standard techniques (See e.g., Maoz and Sagiv, J. Colloid Interface Sci. 100: 465 [1984]).

Calcite

Calcite crystallization was initiated by placing an aliquot of supersaturated $CaCO_3$ solution on the solid supported p-PDA film. The supersaturated solution was prepared by purging stirred aqueous suspensions of $CaCO_3$ with $CO_{2(g)}$, followed by filtration.

In separate experiments, mineralization was conducted using slow diffusion of $(NH_4)_2CO_3$ using standard techniques (See e.g., Addadi and Weiner, Proc. Natl. Acad. Sci. 82: 4110 [1985]).

Iron Oxide

Iron oxide crystallization was initiated by bringing an acidic stoichiometric solution of FeIII/FeII in contact with the film. The pH conditions were changed to basic with the addition of NaOH. Crystallization was accomplished on both water surfaces and solid supports using this technique.

Manganese Oxide

An initial screening was carried out to determine the best method for the deposition of α-$MnO_2$ crystals (chosen because they are most readily synthesized at low temperatures, often in a single step, by solution methods). Procedures involving reduction of $Na_2MnO_4$ (with, e.g., $H_2O_2$) gave gelatinous brown-black products that were x-ray silent (amorphous). Powders produced by heating the gels to 500° C. for twelve hours were identified as α-$MnO_2$ by x-ray powder diffraction (Example 3). Because PDA films cannot withstand high temperatures, these methods were not further considered.

Direct reaction between potassium peroxydisulfate and $MnSO_4$ in 0.1 M $H_2SO_4$ between 45 and 100° C. resulted in the production of very fine brown-black powders. The x-ray powder diffraction patterns were consistent with an α-$MnO_2$ structure, although peaks were broad and the counts were low. This may be due to the very small particle size and poor crystallinity of the products.

It was considered desirable to carry out the reaction at as low a temperature as possible to prevent damage to PDA films. The low solubility of potassium peroxydisulfate in cold water, however, means that the reaction solution must be heated. Forty-five degrees Celcius was considered the lowest practical temperature at which the reaction could be carried out.

For the depositions, a large excess of solid potassium peroxydisulfate was added to solutions of $MnSO_4$ in 0.1 M $H_2SO_4$ at 45° C. over a period of several hours. A large excess of the oxidizer was necessary because aqueous solutions of potassium peroxydisulfate decompose rapidly. Upon addition of potassium peroxydisulfate, the pink solution gradually darkens and a very fine brown-black precipitate forms.

Glass substrates covered with PDA films (as described in Example 1) were placed in the bottom of beakers containing the $MnSO_4$ solution, prior to addition of potassium peroxydisulfate, film side up. Attempts to hang substrates vertically in the solution resulted in severe corrosion of clips used as attachments after addition of oxidizer, and subsequent contamination of the reaction mixture. Because agglomerates of manganese oxide are easily removed from the glass slides simply by rinsing them under a gentle stream of distilled water, placement of substrates horizontally in the solution was not considered problematic, and there were no further attempts to position films vertically.

Depositions carried out as above were successful in that the PDA films were covered with semi-transparent brown films. Perhaps due to the elevated temperature, exposed PDA films changed color from blue to pale pink, indicating an irreversible configuration change, but appeared otherwise intact. Therefore, exposure to potassium peroxydisulfate did not appear to harm the films.

EXAMPLE 3

Film and Crystal Characterization
Fourier Transform Infrared (FTIR)

Fourier transform infrared spectroscopy was used for the in situ analysis of nucleation and growth of crystals associated with surfactant films. This technique detects the induction of structural adaptations caused by nucleation of a particular crystal face with the film.

FTIR was used to detect the effect of calcite crystallization on LB films. Vibrational bands from the hydrophilic headgroup region, C—H stretching bands from the hydrophobic alkyl chains and the carbonate from the forming crystals were readily obtained by detecting a reflected near-normal incidence angle of the IR beam. Calcite crystals were nucleated from different planes (i.e., grew to different morphologies and orientations) depending on the interfacial chemistry of the template film. A wide variety of molecular recognition interactions at functionalized surfactant thin films can be studied using this technique.

The external reflection-absorption mode was employed with a Perkin-Elmer FTIR 2000 system. The instrument was continuously purged with dry nitrogen gas at room temperature. A reflection-absorption assembly allowed beam incidence angles in the range of 10° to 85° from the surface normal. The reflected signal at a resolution of 8 $cm^{-1}$ was detected by a liquid nitrogen cooled MCT (HgCdTe) detector and 1024 scans were accumulated for good signal-to-noise ratio. The single beam spectrum obtained with the monolayer template (R) at the air-water interface was compared with the one without the monolayer template ($R_0$). The quantity $[-\log_{10}(R/R_0)]$ was plotted against the wave number. Monolayers were formed at described in Example 1. After the active surface area of the trough was adjusted by a teflon-barrier (i.e., compressed), the layer was allowed to reach equilibrium. Subsequently, sample spectra were collected.

For calcite mineralization experiments, sample spectra recorded over time were determined. For the crystallization on a polymerized 10,12-pentacosadiynoic acid template, the "background spectrum" (i.e., control) used de-ionized water as monomeric PDA does not polymerize on saturated $CaCO_3$ solution surfaces. The PDA monomers were spread and polymerized as described in Example 1, to form a blue-colored film. Following the polymerization, crystallization was initiated as described in Example 2 and spectra were recorded as a function of time.

Atomic Force Microscolpy

In situ atomic force microscopy was used to reveal the morphology, surface topography, and growth and dissolution characteristics of microscopic crystals, and allows dynamic observations of nucleation events and the determination. Studies were conducted using standard techniques for in situ studies as described by Binnig et al. (Binnig et al., Phys. Rev. Lett. 12: 930 [1986]; and Binnig et al., Europhys. Lett. 3: 1281 [1987])

Two different atomic force microscopes were used in this study. Images larger than 1 $\mu m^2$ were acquired with a commercially available instrument (Park Scientific Instrument). In this case Si ultralevers (Park Scientific Instrument) were used. Commercially available photolithographically patterned glass slides were used to allow imaging of the exact sample region of the film after each temperature step (Bellco Glass). Images smaller than 1 $\mu m^2$ were taken with a home-built AFM (Kolbe et al., Ultramicroscopy 42–44: 1113 [1992]). $Si_3N_4$ cantilevers with a nominal force constant of 0.1 N/m were used (Park Scientific Instruments). Both microscopes were operated in contact mode and in the latter case a four-quadrant position-sensitive photodiode allowed the measurement of the cantilever bending and twisting simultaneously. All images were acquired in contact mode under ambient conditions.

X-ray Diffraction and Scanning Electron Microscopy (SEM)

Powder x-ray diffraction and scanning electron microscopy were conducted using standard techniques, (See e.g., Rochow and Tucker, *Introduction to microscopy by means of light, electrons, X-rays, or acoustics*. Plenum Press [1994]).

EXAMPLE 4

Generation of Nanostructures

The methods and compositions of the present invention can be used to produce nano-crystalline structures such as crystalline polymer wires.

Etching and Filling

A self-assembling monolayer that does not nucleate the desired crystals, such as octadecyltrichlorosilane (OTS) for iron oxide crystals, is deposited onto a silicon wafer (or other desired template). The silicon wafer should be pre-cleaned in an air plasma, treated with 0.1 M potassium hydroxide (KOH) and 0.1 M nitric acid ($HNO_3$) for approximately 2 minutes, and placed in a 1% by weight solution of OTS in clean, dry cyclohexane for 1 hour. An electron beam or ion beam is used to etch selected regions of the film by destroying the monolayer within the targeted region. Electron beams from a PHI Auger spectrometer or ion beams from a TOF-SIMS or FEI ion milling machine will produce the desired etching (see e.g., Rieke et al., Langmuir 10: 619 [1994]). The etched surface is cleaned and silanol groups are re-added to the etched region by an electrochemical oxidation by poising the sample at 1.6 V versus the saturated calomel electrode (SCE). Diacetylene monomers are deposited onto the surface and will associate with the OTS (i.e., associated with the non-etched regions) (other monomer types may be used depending on the type and alignment of crystal growth desired). The wafer is then polymerized with ultraviolet light and used in a crystallization reaction as described in Example 2. The use of supersaturated iron oxide solution will lead to crystal growth only along the etched, sulphate-containing regions.

Etching by Polymerization

Biopolymeric films, such as p-PCA, are generated on desired substrates, such as silicon wafers, as describe above in Examples 1 and 4. The film is then polymerized by an electron beam from the tip of an STM only in certain regions or lines. The substrate and film are then washed with solvent (e.g., chloroform) to remove unpolymerized monomer, leaving only the polymerized region. Crystallization is then initiated as described in Example 2, with crystal growth only occurring on the patterned region.

All publications and patents mentioned in the above specification are herein incorporated by reference. Various modifications and variations of the described method and system of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention that are obvious to those skilled in crystallography, film technology, or related fields are intended to be within the scope of the following claims.

We claim:

1. A method for growing aligned crystals at a polymerized film comprising the steps of:
   a) providing:
      i) diacetylene self-assembling monomers;
      ii) a formation support;
      iii) a polymerization means; and
      iii) a mineral source;
   b) exposing said diacetylene self-assembling monomers to said formation support to produce a film;
   c) polymerizing said film with said polymerization means to produce a template film; and
   d) introducing said mineral source to said template film to form said aligned crystals.

2. The method of claim 1, wherein said diacetylene self-assembling monomers are selected from the group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof.

3. The method of claim 2, wherein said self-assembling monomers contain head groups selected from the group consisting of —COOH, —CH$_2$OH, —CH$_2$OCONHPh, —CH$_2$OCONEt, —CH$_2$CH(Et)OCONHPh, —(CH$_2$)$_9$OH, —CH$_2$OCOPh, —CH$_2$OCHONHMe, —CH$_2$OTs, —CH(OH)Me, —CH$_2$OCOR$_2$, wherein R$_2$ is n-CH$_5$H$_{11}$, n-C$_7$H$_{15}$, n-C$_9$H$_{19}$, n-C$_{11}$H$_{23}$, n-C$_{13}$H$_{27}$, n-C$_{15}$H$_{31}$, n-C$_{17}$H$_{35}$, Ph, PhO, or o-(HO$_2$C)C$_6$H$_4$, —OSO$_2$R$_2$, wherein R$_2$ is Ph, p-MeC$_6$H$_4$, p-FC$_6$H$_4$, p-ClC$_6$H$_4$, pBrC$_6$H$_4$, p-MeOC$_6$H$_4$, m-CF$_3$C$_6$H$_4$, 2-C$_{10}$H7, or Me—CO$_2$M, wherein M is K, H, or B a/2, —CH$_2$OCONHR$_2$ or —CH$_2$CONHR$_2$ where R$_2$ is Et, n-Bu, n-C$_6$H$_{13}$, n-C$_8$H$_{17}$, n-C$_{12}$H$_{25}$, cyclo C$_6$H$_{11}$, Ph, p-MeC$_6$H$_4$, m-MeC$_6$H$_4$, o-ClC$_6$H$_4$, m-ClC$_6$H$_4$, p-ClC$_6$H$_4$, o-MeOC$_6$H$_4$, 3-Thienyl, Me, Et, Ph, 1-C$_{10}$H$_7$, Et, Ph, EtOCOCH$_2$, BuOCOCH$_2$, Me, Et, i-Pr, n-C$_6$H$_{13}$, EtOCOCH$_2$, BuOCOCH$_2$, Ph, 2,4(NO$_2$)$_2$C$_6$H$_3$OCH$_2$, and CH$_2$CH$_2$OH.

4. The method of claim 1, wherein said mineral source comprises a supersaturated solution of dissolved mineral.

5. The method of claim 4, wherein said dissolved mineral is solubilized in aqueous solution.

6. The method of claim 1, wherein said mineral source is selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, C$_{60}$ buckeyballs, and C$_{70}$ buckeyballs.

7. The method of claim 1, wherein said formation support comprises a Langmuir-Blodgett trough.

8. The method of claim 1, further comprising the steps of:
   f) providing a solid support; and
   g) transferring said template film to said solid support following said polymerizing step but before introducing said mineral source.

9. The method of claim 8, wherein said solid support comprises a hydrophobized, horizontal support.

10. The method of claim 1, wherein said film is compressed into a monolayer having a surface tension range of approximately twenty to forty millinewtons per meter prior to said polymerizing.

11. The method of claim 1, wherein said polymerization means is selected from the group consisting of UV-irradiation, gamma irradiation, X-ray irradiation, and electron beam exposure.

12. The method of claim 1, wherein said introducing said mineral source to said template film comprises placing an aliquot of said mineral source onto said template film.

13. The method of claim 1, further comprising providing a solvent and an etched film support.

14. The method of claim 13, wherein in said step c) said polymerizing produces an etched film, and further comprising steps:
   h) washing said etched film with said solvent after said polymerizing but before said introduction of said mineral source; and
   i) transferring said etched film to said etched film support after said washing but before said introduction of said mineral source.

15. The method of claim 13, wherein said etched film support comprises a semiconducting or metallic substrate.

16. The method claim 15, wherein said semiconducting or metallic substrate is selected from the group consisting of gold, titanium oxide, and gallium arsenate.

17. Aligned crystals produced according to the methods of claim 13.

18. Aligned crystals produced according to the methods of claim 1.

19. A method for growing totally aligned crystals on polymerized organic nanostructures comprising the steps of:
   a) providing:
      i) at least two compounds capable of forming a self-assembling monolayer;
      ii) a solid support;
      iii) a polymerization means;
      iv) a template film;
      v) a mineral source; and
      vi) an energetic beam emitter;
   b) placing said compounds on said solid support;
   c) etching said film with said energetic beam emitter to produce an etched film;
   d) disposing said template film on said etched film;
   e) polymerizing said template film with said polymerization means; and
   f) introducing said mineral source to said template film to produce said totally aligned crystals.

20. The method of claim 19, wherein said template film comprises self-assembling monomers selected from the group consisting of diacetylenes, acetylenes, alkenes, thiophenes, imides, acrylamides, methacrylates, vinylether, malic anhydride, urethanes, allylamines, siloxanes anilines, pyrroles, vinylpyridinium.

21. The method of claim 20, wherein said diacetylenes are selected from the group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof.

22. The method of claim 20, wherein said self-assembling monomers contain head groups selected from the group consisting of —COOH, —CH$_2$OH, —CH$_2$OCONHPh, —CH$_2$OCONEt, —CH$_2$CH(Et)OCONHPh, —CH$_2$)$_9$OH, —CH$_2$OCOPh, —CH$_2$OCHONHMe, —CH$_2$OTs, —CH(OH)Me, —CH$_2$OCOR$_2$, wherein R$_2$ is n-CH$_5$H$_{11}$, n-C$_7$H$_{15}$, n-C$_9$H$_{19}$, n-C$_{11}$H$_{23}$, n-C$_{13}$H$_{27}$, n-C$_{15}$H$_{31}$, n-C$_{17}$H$_{35}$, Ph, PhO, or o-(HO$_2$C)C$_6$H$_4$, —OSO$_2$R$_2$, wherein R$_2$ is Ph, P-MeC$_6$H$_4$, p-FC$_6$H$_4$, p-ClC$_6$H$_4$, pBrC$_6$H$_4$, p-MeOC$_6$H$_4$, m-CF$_3$C$_6$H$_4$, 2-C$_{10}$H7, or Me—CO$_2$M, wherein M is K, H, or B a/2, —CH$_2$OCONHR$_2$ or —CH$_2$CONHR$_2$ where R$_2$ is Et, n-Bu, n-C$_6$H$_{13}$, n-C$_8$H$_{17}$, n-C$_{12}$H$_{25}$, cyclo C$_6$H$_{11}$, Ph, p-MeC$_6$H$_4$, m-MeC$_6$H$_4$, o-ClC$_6$H$_4$, m-ClC$_6$H$_4$, p-ClC$_6$H$_4$, o-MeOC$_6$H$_4$, 3-Thienyl, Me, Et, Ph, 1-C$_{10}$H$_7$, Et, Ph, EtOCOCH$_2$, BuOCOCH$_2$, Me, Et, i-Pr, n-C$_6$H$_{13}$, EtOCOCH$_2$, BuOCOCH$_2$, Ph, 2,4(NO$_2$)$_2$C$_6$H$_3$OCH$_2$, or CH$_2$CH$_2$OH.

23. The method of claim 19, wherein said mineral source comprises a supersaturated solution of dissolved mineral.

24. The method of claim 19, wherein said dissolved mineral is solubilized in aqueous solution.

25. The method of claim 19, wherein said mineral source is selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, C$_{60}$ buckeybalss, and C$_{70}$ buckeyballs.

26. The method of claim 19, wherein said polymerization means is selected from the group consisting of UV-irradiation, gamma irradiation, X-ray irradiation, and electron beam exposure.

27. The method of claim 19, wherein said introducing said mineral source to said template film comprises placing an aliquot of said mineral source onto said template film.

28. The method of claim 19, wherein said solid support comprises a semiconducting or metallic substrate.

29. The method of claim 28, wherein said semiconducting or metallic substrate is selected from a group consisting of gold, titanium oxide, and gallium arsenate.

30. The method of claim 19, wherein said energetic beam emitter emits beams selected from the group consisting of ion beams and electron beams.

31. The method of claim 19, wherein said film is compressed prior to said etching.

32. Aligned crystals produced according to the methods of claim 18.

33. A composition comprising totally aligned crystals on polymerized film.

34. The composition of claim 33, whereby said totally aligned crystals are selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, C$_{60}$ buckeyballs, and C$_{70}$ buckeyballs.

35. A method for growing totally aligned crystals at a polymerized film comprising the steps of:
 a) providing:
  i) self-assembling monomers;
  ii) a formation support;
  iii) a polymerization means; and
  iii) a mineral source;
 b) exposing said self-assembling monomers to said formation support to produce a film;
 c) polymerizing said film with said polymerization means to produce a template film;
 d) introducing said mineral source to said template film to form said crystals.

36. The method of claim 35, wherein said self-assembling monomers are selected from the group consisting of diacetylenes, acetylenes, alkenes, thiophenes, imides, acrylamides, methacrylates, vinyether, malic anhydride, urethanes, allylamines, siloxanes anilines, pyrroles, and vinylpyridinium.

37. The method of claim 36, wherein said diacetylenes are selected from a group consisting of 10,12-pentacosadiynoic acid, 5,7-pentacosadiynoic acid, sulfate-derivatized 10,12-pentacosadiynoic acid, sulfate-derivatized 5,7-pentacosadiynoic acid, and combinations thereof.

38. The method of claim 35, wherein said mineral source is selected from the group consisting of calcium carbonate, iron oxide, manganese oxide, cadmium sulfide, cadmium selenide, tin oxide, aluminum oxide, lead sulfide, titanium oxide, indium phosphate, calcium phosphate, hydroxy apatite, mercury sulfide, tungsten oxide, nanocrystalline gold, nanocrystalline silver, nanocrystalline platinum, carbon nanotubes, boron nanotubes, C$_{60}$ buckeyballs, and C$_{70}$ buckeyballs.

* * * * *

UNITED STATES PATENT AND TRADEMARK OFFICE
CERTIFICATE OF CORRECTION

PATENT NO. : 6,017,390          Page 1 of 6
DATED      : 01/25/2000
INVENTOR(S): CHARYCH et al.

It is certified that error appears in the above-identified patent and that said Letters Patent is hereby corrected as shown below:

IN THE SPECIFICATION

Please delete "abandoned" and insert -- issued Nov. 30, 1999 as Patent No. 5,994,132 --.

In column 2, line 58, please delete "polyrmerized" and insert --polymerized--.

In column 2, line 59, please delete "monomers" and insert --monomer--.

In column 3, line 3, please delete "siloxanes anilines" and insert --siloxanes, anilines--.

In column 3, line 12, please delete "-CH$_2$)$_9$OH" and insert ---(CH$_2$)$_9$OH--.

In column 3, line 17, please delete "p-CIC$_6$H$_4$" and insert --p-ClC$_6$H$_4$--.

In column 3, line 18, please delete "2-C$_{10}$H7" and insert --2-C$_{10}$H$_7$--.

In column 3, line 21, please delete "m-MeC$_4$, o-CIC$_6$H$_4$, m-CIC$_6$H$_4$, p-CIC$_6$H$_4$" and insert --m-MeC$_6$H$_4$, o-ClC$_6$H$_4$, m-ClC$_6$H$_4$, p-ClC$_6$H$_4$--.

In column 3, line 62, please delete "he" and insert --the--.

In column 4, line 7, please delete "firming" and insert --forming--.

UNITED STATES PATENT AND TRADEMARK OFFICE
CERTIFICATE OF CORRECTION

PATENT NO. : 6,017,390
DATED : 01/25/2000
INVENTOR(S) : CHARYCH et al.

It is certified that error appears in the above-identified patent and that said Letters Patent is hereby corrected as shown below:

In column 4, line 19, please delete "siloxanes anilines" and insert --siloxanes, anilines--.

In column 4, line 29, please delete "-$CH_2)_9OH$" and insert ---$(CH_2)_9OH$--.

In column 4, line 34, please delete "p-$CIC_6H_4$" and insert --p-$ClC_6H_4$--.

In column 4, line 35, please delete "2-$C_{10}H7$" and insert --2-$C_{10}H_7$--.

In column 4, line 38, please delete "o-$CIC_6H_4$, m-$CIC_6H_4$, p-$CIC_6H_4$" and insert --o-$ClC_6H_4$, m-$ClC_6H_4$, p-$ClC_6H_4$--.

In column 5, line 36, please delete "siloxanes anilines" and insert --siloxanes, anilines--.

In column 5, line 51, please delete "p-$CIC_6H_4$" and insert --p-$ClC_6H_4$--.

In column 5, line 52, please delete "2-$C_{10}H7$" and insert --2-$C_{10}H_7$--.

In column 5, line 55, please delete "o-$CIC_6H_4$, m-$CIC_6H_4$, p-$CIC_6H_4$" and insert --o-$ClC_6H_4$, m-$ClC_6H_4$, p-$ClC_6H_4$--.

UNITED STATES PATENT AND TRADEMARK OFFICE
CERTIFICATE OF CORRECTION

PATENT NO. : 6,017,390
DATED : 01/25/2000
INVENTOR(S) : CHARYCH et al.

It is certified that error appears in the above-identified patent and that said Letters Patent is hereby corrected as shown below:

In column 5, line 64, please delete "is."

In column 6, line 20, please delete "siloxanes anilines" and insert --siloxanes,
anilines--.

In column 6, line 35, please delete "p-CIC$_6$H$_4$" and insert --p-ClC$_6$H$_4$--.

In column 6, line 36, please delete "2-C$_{10}$H7" and insert --2-C$_{10}$H$_7$--.

In column 6, line 39, please delete "o-CIC$_6$H$_4$, m-CIC$_6$H$_4$, p-CIC$_6$H$_4$" and insert
--o-ClC$_6$H$_4$, m-ClC$_6$H$_4$, p-ClC$_6$H$_4$--.

In column 8, line 60, please delete "siloxanes anilines" and insert --siloxanes,
anilines--.

In column 9, line 2, please delete "p-CIC$_6$H$_4$" and insert --p-ClC$_6$H$_4$--.

In column 9, line 3, please delete "2-C$_{10}$H7" and insert --2-C$_{10}$H$_7$--.

In column 9, line 6, please delete "o-CIC$_6$H$_4$, m-CIC$_6$H$_4$, p-CIC$_6$H$_4$" and insert
--o-ClC$_6$H$_4$, m-ClC$_6$H$_4$, p-ClC$_6$H$_4$--.

In column 11, line 19, please delete "of."

UNITED STATES PATENT AND TRADEMARK OFFICE
CERTIFICATE OF CORRECTION

PATENT NO. : 6,017,390
DATED : 01/25/2000
INVENTOR(S) : CHARYCH et al.

It is certified that error appears in the above-identified patent and that said Letters Patent is hereby corrected as shown below:

In column 11, line 66, please delete "α" and insert --a--.

In column 13, line 51, please delete "associated" and insert --associate--.

In column 14, line 15, please delete "are" and insert --at--.

In column 15, line 15, please delete "stearic" and insert --steric--.

In column 15, line 15, please delete "produces" and insert --produce--.

In column 15, line 18, please delete "structures" and insert --structure--.

In column 15, line 23, please delete "can be."

In column 15, line 52, please delete "stearic" and insert --steric--.

In column 16, line 28, please delete "alignments" and insert --alignment--.

In column 19, line 20, please delete "the."

In column 20, line 29, please delete "(calcium" and insert --calcium--.

In column 20, line 40, between "separating" and "samples" please delete "a."

UNITED STATES PATENT AND TRADEMARK OFFICE
CERTIFICATE OF CORRECTION

PATENT NO. : 6,017,390
DATED : 01/25/2000
INVENTOR(S) : CHARYCH et al.

It is certified that error appears in the above-identified patent and that said Letters Patent is hereby corrected as shown below:

In column 21, line 14, please delete "FeII" and insert --FeII--.

In column 21, line 26, please delete "Belico" and insert --Bellco--.

In column 23, line 49, please delete "at" and insert --as--.

In column 24, line 62, please delete "describe" and insert --described--.

IN THE CLAIMS:

In Claim 3 at column 25, line 44, please delete "p-CIC$_6$H$_4$" and insert --p-ClC$_6$H$_4$--.

In Claim 3 at column 25, line 45, please delete "2-C$_{10}$H7" and insert --2-C$_{10}$H$_7$--.

In Claim 3 at column 25, line 48, please delete "o-CIC$_6$H$_4$, m-CIC$_6$H$_4$, p-CIC$_6$H$_4$" and insert --o-ClC$_6$H$_4$, m-ClC$_6$H$_4$, p-ClC$_6$H$_4$--.

In Claim 20 at column 26, line 63, please delete "siloxanes anilines" and insert
--siloxanes anilines--.

In Claim 22 at column 27, line 11, please delete "p-CIC$_6$H$_4$" and insert --p-ClC$_6$H$_4$--.

UNITED STATES PATENT AND TRADEMARK OFFICE
CERTIFICATE OF CORRECTION

PATENT NO. : 6,017,390
DATED : 01/25/2000
INVENTOR(S) : CHARYCH et al.

It is certified that error appears in the above-identified patent and that said Letters Patent is hereby corrected as shown below:

In Claim 22 at column 27, line 11, please delete "P-MeC$_6$H$_4$" and insert --p-MeC$_6$H$_4$--.

In Claim 22 at column 27, line 12, please delete "2-C$_{10}$H7" and insert --2-C$_{10}$H$_7$--.

In Claim 22 at column 27, line 15, please delete "o-CIC$_6$H$_4$, m-CIC$_6$H$_4$, p-CIC$_6$H$_4$" and insert --o-ClC$_6$H$_4$, m-ClC$_6$H$_4$, p-ClC$_6$H$_4$--.

In Claim 25 at column 27, line 31, please delete "buckeybalss" and insert --buckeyballs--.

In Claim 36 at column 28, line 31, please delete "vinyether" and insert --vinylether--.

Signed and Sealed this

Third Day of April, 2001

Attest:

*Attesting Officer*

NICHOLAS P. GODICI

*Acting Director of the United States Patent and Trademark Office*